United States Patent [19]
Uchida et al.

[11] Patent Number: 6,022,669
[45] Date of Patent: Feb. 8, 2000

[54] METHOD OF FABRICATING AN INTEGRATED CIRCUIT USING SELF-PATTERNED THIN FILMS

[75] Inventors: Hiroto Uchida; Nobuyuki Soyama; Kensuke Kageyama; Katsumi Ogi, all of Saitama, Japan; Michael C. Scott, Colorado Springs, Colo.; Joseph D. Cuchiaro, Colorado Springs, Colo.; Gary F. Derbenuick, Colorado Springs, Colo.; Larry D. McMillan, Colorado Springs, Colo.; Carlos A. Paz de Araujo, Colorado Springs, Colo.

[73] Assignees: Symetrix Corporation, Colorado Springs, Colo.; Mitsubishi Materials Corporation, Japan

[21] Appl. No.: 08/687,721

[22] Filed: Jul. 26, 1996

Related U.S. Application Data

[63] Continuation-in-part of application No. 08/434,312, May 2, 1995, Pat. No. 5,605,723, and a continuation-in-part of application No. 08/653,444, May 24, 1996, Pat. No. 5,792,592.

[51] Int. Cl.[7] .................................. G03F 7/00; G03C 1/73
[52] U.S. Cl. .......................... 430/313; 430/311; 430/314
[58] Field of Search ..................................... 430/311, 313, 430/330, 315

[56] References Cited

U.S. PATENT DOCUMENTS

| | | | |
|---|---|---|---|
| 4,621,045 | 11/1986 | Goodner | 430/330 |
| 4,707,897 | 11/1987 | Rohrer et al. | 29/25.42 |
| 5,024,964 | 6/1991 | Rohrer et al. | 437/47 |
| 5,137,799 | 8/1992 | Kaempf et al. | 430/270 |
| 5,241,300 | 8/1993 | Rohrer et al. | 257/295 |
| 5,423,285 | 6/1995 | Paz de Araujo et al. | 117/90 |
| 5,447,824 | 9/1995 | Mutsaers et al. | 430/315 |
| 5,453,347 | 9/1995 | Bullington et al. | 430/311 |
| 5,468,684 | 11/1995 | Yoshimori et al. | 437/228 |
| 5,503,961 | 4/1996 | Linde et al. | 430/315 |
| 5,519,234 | 5/1996 | Paz De Araujo et al. | 257/295 |
| 5,605,723 | 2/1997 | Ogi et al. | 427/533 |
| 5,630,872 | 5/1997 | Ogi et al. | 106/287.18 |
| 5,688,565 | 11/1997 | McMillan et al. | 427/565 |
| 5,792,592 | 8/1998 | Uchida et al. | 430/313 |

OTHER PUBLICATIONS

Nakao, et al.; Micro–Patterning of $PbZr_xTi_{1-x}O_3$ Thin Films Prepared by Photo Sensitive Sol–Gel Solution; Sep. 1993; Jpn. J. Appl. Phys. vol. 32, (1993); pp. 4141–4143; Part 1, No. 9B.

Soyama et al.; The Formation of a Fine–Patterned Ferroelectric Thin Film from a Sol–Gel Solution Containing a Photo–Sensitive Water–Generator; 1994; ISAF.

Smolenskii et al.; Ferroelectricity and Related Phenomena (a series of books); Feroelectrics and Related materials; Oxygen–Octahdral Ferroelectrics; pp. 690–702.

*Primary Examiner*—Sharon Gibson
*Assistant Examiner*—Jill N. Holloman
*Attorney, Agent, or Firm*—Duft, Graziano & Forest, P.C.

[57] ABSTRACT

A first photosensitive liquid solution is applied to a substrate, patterned through exposure to radiation and development, and annealed to form a desired solid material, such as $SrBi_2Ta_2O_9$, that is incorporated into a component of an integrated circuit Fabrication processes are designed protect the self-patterned solid material from conventional IC processing and to protect the conventional materials, such as silicon, from elements in the self-patterned solid material. In one embodiment, a layer of bismuth oxide is formed on the $SrBi_2Ta_2O_9$ and a silicon oxide hole is etched to the bismuth oxide. The bismuth oxide protects the $SrBi_2Ta_2O_9$ from the etchant, and is reduced by the etchant to bismuth. Any remaining bismuth oxide and much of the bismuth are vaporized in the anneal, and the remaining bismuth is incorporated into the $SrBi_2Ta_2O_9$.

34 Claims, 12 Drawing Sheets

METHOD OF FABRICATING AN INTEGRATED CIRCUIT USING SELF-PATTERNED THIN FILMS

This application is a continuation-in-part application of U.S. patent application Ser. No. 434,312 filed May 2, 1995, now U.S. Pat. No. 5,605,723 issued Feb. 25, 1997 and is also a continuation-in-part application of U.S. patent application Ser. No. 5,653,444 filed May 24, 1996, now U.S. Pat. No. 5,792,592 issued Aug. 11, 1998.

BACKGROUND OF THE INVENTION

1. Field of the Invention

The invention relates to the fabrication of integrated circuits using selfpatterned thin films, and more particularly to the fabrication of integrated circuits utilizing self-patterned layered superlattice material thin films.

2. Statement of the Problem

As is well-known, integrated circuits (ICs) are fabricated by layering and patterning thin films on a substrate, such as a silicon or gallium arsenide wafer. The patterning process is a complicated and expensive one that normally requires the application of a photo resist layer, exposure of the resist through a mask to define the device pattern, etching to remove portions of the thin film materials, and removal of the remaining resist in a solvent wash.

It is known that some materials, such as PZT, may be self-patterned, thereby eliminating the need for some of the photo-resist and etching steps. See, Yuichi Nakao, et. al., *Micro-Patterning of $PbZr_xTi_{1-x}O_3$ Thin Films Prepared by Photo Sensitive Sol-Gel Solutions*, Jpn. J. Appl. Phs. Vol. 32, Part 1, No. 9B, pp. 4141–4143, September 1993 and Soyama et al., *The Formation of a Fine-Patterned Ferroelectric Thin-Film From a Sol-Gel Solution Containing a Photo-Sensitive Water Generator*, Proceedings Of The International Symposium On Applied Ferroelectrics (1994). In this self-patterning method, a photo-sensitive sol-gel solution is applied to a substrate and exposed to UV radiation through a mask. The UV radiation causes reactions that accelerate polymerization in the areas exposed to the radiation. The mask prevents polymerization of selected portions of the film by blocking ultraviolet radiation. The exposed substrate is then developed by washing it to remove the unpolymerized portions, thereby leaving a fine micro pattern over the area that was polymerized by exposure to ultraviolet radiation. The micro pattern consists of a polymerized PZT film that is insoluble in the developing solution. The patterned thin film is then annealed to form a solid PZT pattern.

While the above process is an important advance in the art, there remains a problem in applying the process to the fabrication of integrated circuits. Conventional integrated processes are not compatible with a self-patterned thin film of a material such as PZT. For example, PZT is easily damaged by etches that are used to pattern subsequent layers, such as the interlayer dielectrics, and the self-patterning process leaves it exposed to such etches. Thus, the self-patterning process and materials cannot be used in conventional integrated fabrication processes without further advances in the art.

Recently, interest in the ferroelectric field has shifted to a new class of materials, called layered superlattice materials, which have been found to be far superior to PZT for ferroelectric uses. See for example, U.S. Pat. No. 5,519,234 issued May 21, 1996. These materials are more complex than PZT; while PZT is a solid solution of two $ABO_3$ type perovskites, layered superlattice materials are materials that spontaneously form complex crystal structures having collated intergrowth layers. Thus, they are more difficult to form than PZT and are more susceptible to damage by conventional integrated circuit processing. Moreover, some of the elements contained in the layered superlattice materials can be damaging to semiconductors and other materials, such as silicon, conventionally used in integrated circuits. Thus, if the advances represented by the discovery of the superior properties of the layered superlattice are to be utilized in a self-patterning integrated circuit fabrication process, there is a need both for a self-patterning process that produces high quality layered superlattice materials and for an integrated circuit fabrication process that permits such a self-patterned material to be successfully utilized in combination with the more conventional materials and processes in the integrated circuit art.

SUMMARY OF THE INVENTION

The invention solves the above problems by providing the first integrated circuit fabrication process that can be successfully used in combination with the process of forming a self-patterned material. In the process of the invention, the self-patterned material is not exposed to any harsh processes, such as acid etches, that occur in conventional integrated circuit fabrication methods. In the process according to the invention, the self-patterning process is combined with other IC processes so that while the self-patterned material is exposed, holes and other patterns conventionally made by acid etches are instead made by development solvents, such as xylenes, n-butyl acetate, and methanol. In addition, the self-patterned material is completely enclosed by protective materials.

The invention includes a lift-off process for forming an integrated circuit capacitor. The lift-off process utilizes photo resist development and stripping solvents to pattern the portions of the integrated circuit that enclose the self-patterned material. At the end of the lift-off process according to the invention, the self-patterned material is completely enclosed by the substrate on which it is formed, an interlayer dielectric (ILD), and the top electrode of the capacitor.

The invention also provides a process that incorporates a conventional $SiO_2$ hole acid etch. However, a protective layer covers the self-patterned material during the etch. The protective material is a material that is consumed or incorporated in to the self-patterned material during the normal processing of the IC. For example, either bismuth-enriched strontium bismuth tantalate or bismuth oxide ($Bi_2O_3$) may be used as a protective layer if the self-patterned material is strontium bismuth tantalate ($SrBi_2Ta_2O_9$) or strontium bismuth tantalum niobate ($SrBi_2Ta_xNb1-xO_9$. The etch reduces the protective material, and the subsequent anneal vaporizes the bismuth oxide and bismuth, and incorporates any remaining bismuth or bismuth oxide into the strontium bismuth tantalate or strontium bismuth tantalum niobate, which are not sensitive to moderate amounts of excess bismuth.

The invention also provides a process that incorporates a self-patterning ILD in combination with a self-patterning active material. This results in the selfpatterning material being exposed only to the development solvents for the self-patterning ILD material, which solvents are relatively benign to the self-patterning material as compared to conventional etch materials.

The invention further provides a process that utilizes a conventional $SiO_2$ hole etch. The $SiO_2$ hole etch occurs before the self-patterned material is formed, and in the process steps immediately after it is formed, the self-patterned material is completely enclosed by protective substances.

In addition, the invention provides a chemical-mechanical polishing (CMP) process that can be used in combination with the self-pattern material.

In still another aspect the invention provides an IC incorporating a self-patterned material, and a fabrication process for making the IC, which prevents shrinkage of the self-patterned material during the anneal process from leading to shorts between the electrodes of a capacitor. The self-patterned material is formed in a via in an ILD, and the outer circumference of the layer of material overlaps the edges of the via sufficiently so that it will still fully plug the via after any shrinkage in the anneal.

The invention provides a method of fabricating an integrated circuit comprising the steps of: providing a substrate; providing a first photosensitive liquid solution including one or more elements in appropriate amounts for forming a first desired material upon applying the first photosensitive liquid solution to the substrate to form a thin film, exposure of the thin film to radiation, development of the thin film, and treating of the film to form a solid material; applying the first photosensitive liquid solution to the substrate to form a first thin film of the first photosensitive liquid solution on the substrate; patterning the first thin film through exposure of the first film to radiation and subsequent development; treating the first thin film to form a first solid film of the first desired material; and completing the fabrication of the integrated circuit to include at least a portion of the first solid film in a component of the integrated circuit. Preferably, the step of completing includes incorporating the portion of the solid film in an active component of the integrated circuit. Preferably, the first desired material comprises a layered superlattice material. Preferably, the layered superlattice material comprises a material selected from the group consisting of: strontium bismuth tantalate, strontium bismuth niobate, strontium bismuth tantalum niobate, strontium bismuth titanate, bismuth titanate, lead bismuth niobate, barium bismuth tantalate, lead bismuth tantalate, and barium bismuth niobate. Preferably, the first desired material includes an element selected from the group consisting of: the transition metals, the lanthanide series metals, the rare earth metals, the alkali metals, magnesium, zinc, cadmium, aluminum, gallium, indium, thallium, germanium, lead, tin, antimony, bismuth, selenium, tellurium, phosphorous, silicon, and boron, and the transition metals include scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals include cerium, praseodymium, neodymium, promethium, samarium, europium, gadolinium, terbium, dysprosium, holmium, erbium, thulium, ytterbium, and lutetium; the rare earth metals include calcium, strontium, barium, and radium; and the alkali metals include lithium, sodium, potassium, rubidium, cesium, and francium. Preferably, the step of completing includes a step of patterning a portion of the integrated circuit with a lift-off process. Preferably, the step of patterning with a liftoff process comprises the steps of: depositing a layer of photo resist over the solid film; patterning the photo resist by exposure to radiation through a mask and developing it to create a hole through the resist to the solid film; forming a layer of a substance on the photo resist and on the solid film in the region of the hole; and stripping the photo resist to remove the substance except substantially in the area where it contacts the solid film. Alternatively, the step of patterning with a liftoff process comprises the steps of: depositing a layer of photo resist over the solid film; forming a layer of a first substance on the photo resist; patterning the first substance to create a hole exposing the photo resist; etching the photo resist to extend the hole through the photo resist to the solid film; forming a layer of a second substance on the first substance and on the solid film in the region of the hole; and stripping the photo resist to remove the first substance and to remove the second substance except substantially in the area where it contacts the solid film. Preferably, the method of the invention also includes the steps of: providing a second photosensitive liquid solution including one or more elements in appropriate amounts for forming a second desired material upon forming a thin film of the second photosensitive liquid solution, exposure of the thin film to radiation, development of the thin film, and treating of the film to form a second solid material; applying the second photosensitive liquid solution to the first thin film to form a second thin film of the second photosensitive liquid solution on the first thin film; patterning the second thin film through exposure of the second thin film to radiation and subsequent development; treating the second thin film to form a second solid film of the second desired material; forming a layer of a substance on the second thin film; and patterning the substance to create a hole to the second thin film, whereby the second thin film protects the first thin film during the creation of the hole. Preferably, the step of patterning the substance includes reducing the second thin film and the step of treating the first thin film comprises evaporating the reduced second thin film and incorporating whatever remains of the second thin film into the first solid film. The step of applying the second photosensitive liquid solution may be performed after the step of treating the first thin film or the steps of treating the first thin film and treating the second thin film may be performed simultaneously. Alternatively, the method also includes the steps of: providing a second photosensitive liquid solution including one or more elements in appropriate amounts for forming an insulating material upon applying the second photosensitive liquid solution to the first thin film, exposure of the thin film to radiation, development of the thin film, and treating of the film to form a second solid material; applying the first photosensitive liquid solution to the first thin film to form a second thin film of the second photosensitive liquid solution on the substrate; patterning the second thin film through exposure of the second thin film to radiation and subsequent development; treating the second thin film to form a second solid film of the insulator overlying the first solid film; and the step of completing comprises completing the fabrication of the integrated circuit to include at least a portion of the second solid film in a component of the integrated circuit. Preferably, the step of patterning comprises creating a hole through the second thin film to the first thin film, and forming a layer of a substance on the second thin film and contacting the first thin film. Again, the steps of treating the first thin film and treating the second thin film may be performed simultaneously or separately. In another variation of the invention, the step of providing a substrate comprises providing a substrate including a layer of insulator having a hole in it; the step of applying includes forming at least a portion of the first thin film in the hole; and the step of completing includes forming a layer of a substance on the first solid thin film and the insulator and patterning the layer of the substance so the first solid film is completely enclosed by the substrate, the insulator, and the substance. Preferably, the step patterning further comprises forming the first thin film so that it plugs the hole, with a first portion within the hole and a second portion, contiguous with the first portion, overlaps the edges of the hole sufficiently so that upon shrinkage in the treating step, the first thin film still completely plugs the hole. The step of patterning may comprise ion milling or chemical-mechanical polishing.

In another aspect, the invention provides a method of fabricating an integrated circuit including a layered superlattice material, the method comprising the steps of: providing a substrate; providing a first photosensitive liquid solution including one or more elements in appropriate amounts for forming a layered superlattice material upon applying the first photosensitive liquid solution to the substrate to form a thin film, exposure of the thin film to radiation, development of the thin film, and treating of the film to form a solid material; applying the first photosensitive liquid solution to the substrate to form a first thin film of the first photosensitive liquid solution on the substrate; patterning the first thin film through exposure of the first film to radiation and subsequent development; treating of the first thin film to form a first solid film of the layered superlattice material; and completing the fabrication of the integrated circuit to include at least a portion of the layered superlattice material in a component of the integrated circuit. Preferably, the method further includes the steps of: providing a second photosensitive liquid solution including one or more elements in appropriate amounts for forming a protective material upon forming a thin film of the second photosensitive liquid solution, exposure of the thin film to radiation, development of the thin film, and treating of the film to form a second solid material; applying the second photosensitive liquid solution to the first thin film to form a second thin film of the second photosensitive liquid solution on the first thin film; patterning the second thin film through exposure of the second thin film to radiation and subsequent development; treating the second thin film to form a second solid film of the protective material; forming a layer of a substance on the second thin film; and patterning the substance to create a hole to the second thin film, whereby the protective material protects the first thin film during the creation of the hole. Preferably, the step of patterning the substance includes reducing the protective material and the step of treating the first thin film comprises evaporating the reduced material and incorporating whatever remains of the reduced material into the layered superlattice material. Preferably, the step of applying the second photosensitive liquid solution is performed after the step of treating the first thin film or the two steps are performed simultaneously.

The process of the invention not only makes it possible to incorporate self-patterned active elements into an integrated circuit, but also permits the process of making the self-patterned material to be easily integrated with conventional integration fabrication processes. This significantly reduces the expense and roadblocks in converting to the self-patterning materials. Numerous other features, objects and advantages of the invention will become apparent from the following description when read in conjunction with the accompanying drawings.

DETAILED DESCRIPTION OF THE PREFERRED EMBODIMENT

Figure 1:
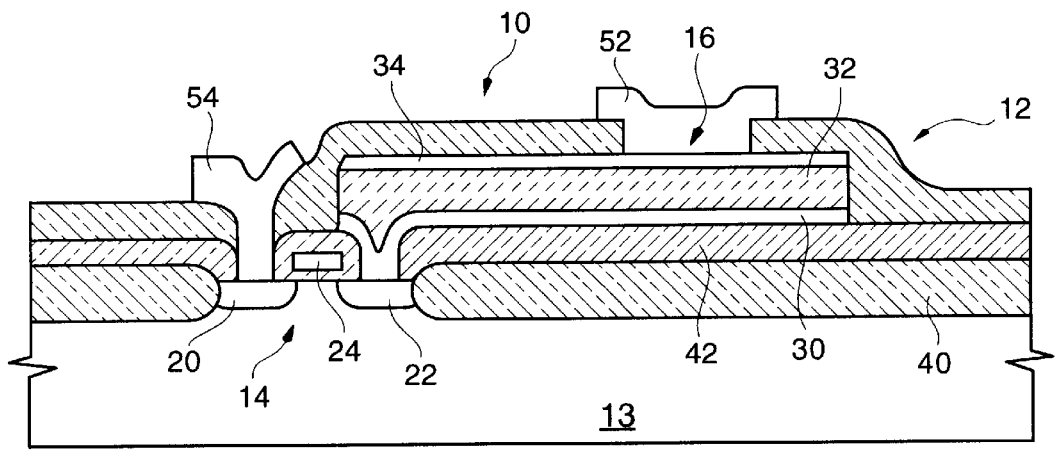
FIG. 1 is a cross-sectional view of a DRAM integrated circuit memory cell made using the methods of the invention.
Figure 2:
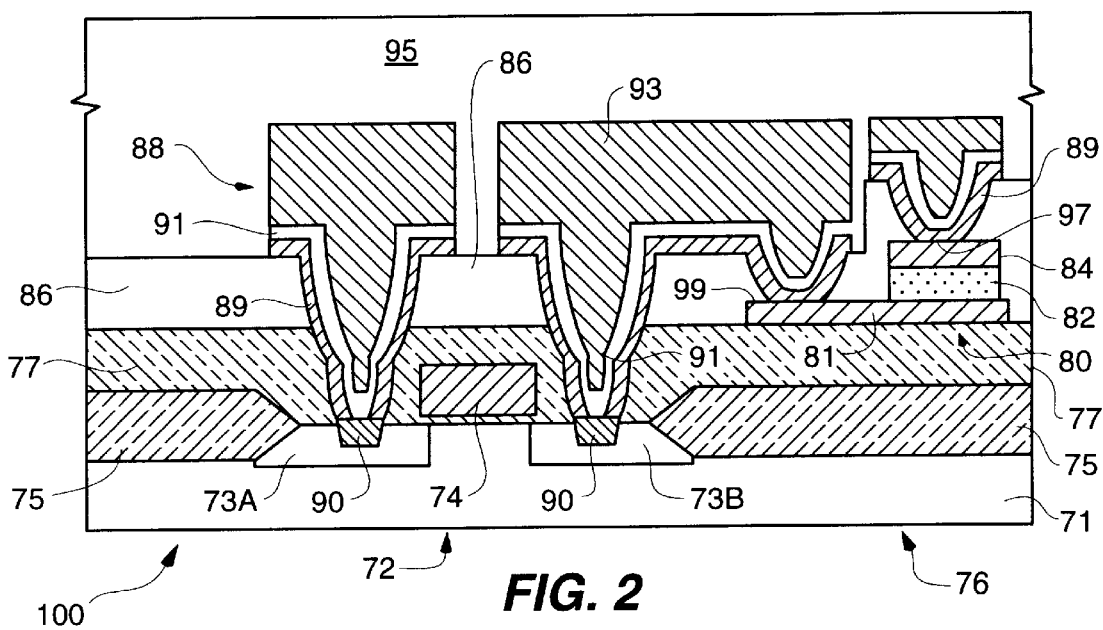
FIG. 2 is a cross-sectional view of the preferred embodiment of a DRAM integrated circuit memory cell made using the methods of the invention.

FIGS. 1 and 2 illustrate portions of integrated circuits 10, 100 as may be fabricated using the method of the invention. It should be understood that FIGS. 1 and 2 and the figures discussed below depicting integrated circuit portions in the various stages of fabrication, are not meant to be actual cross-sectional views of any particular portion of an actual semiconducting device, but are merely idealized representations which are employed to more clearly and fully depict the structure and process of the invention than would otherwise be possible. For example, in actual devices the relative thickness of the various layers may be such that if the layers were shown in actual relative proportions, the entire cell could not fit on a page; as another example, in actual devices, the layers are not as sharply contoured as in the layers shown. Both of the particular circuit portions 10 and 100 shown in FIGS. 1 and 2, respectively, represent a single memory cell 12, 76, respectively, of a 1T/1C (one transistor/one capacitor) DRAM or FERAM that is a well-known integrated circuit in the art. As is known in the art, if the material 32, 82 is a dielectric material, the cell is commonly called a DRAM cell, while if the material 32, 82 is a ferroelectric material, the cell is commonly called an FERAM cell. Turning to FIG. 1, cell is preferably fabricated on a silicon wafer 13 and includes a transistor 14 and a capacitor 16. Transistor 14 includes a source 20, a drain 22, and a gate 24. Capacitor 16 includes a bottom electrode 30, a dielectric 32, and a top electrode 34. Field oxide regions 40 formed on the wafer 13 separate the various cells in the integrated circuit, and insulating layers, such as 42, separate the individual electronic elements, such as transistor 14 and capacitor 16. The bottom electrode 30 of capacitor 16 is connected to the drain 24 of transistor 14. Wiring layers 54 and 52 connect the source of the transistor 14 and the top electrode of capacitor 16, respectively, to other portions of the integrated circuit 10. The invention particularly relates to a method of fabricating such a capacitor 16, therefor the structure and method of fabrication of such a capacitor will be discussed in more detail below. The other portions may be fabricated as disclosed in U.S. patent application Ser. No. 08/276,474 filed Jul. 18, 1994 or any other conventional manner.

In the DRAM/FERAM of FIG. 1 the capacitor 16 is formed in close proximity to transistor 14, the lower electrode 30 directly contacting the drain 22 of the transistor 72. FIG. 2 shows another embodiment of a 1T/1C DRAM/FERAM cell 76 in which the capacitor 80 is formed on a thick insulating layer 77 which separates the capacitor from the transistor 72. This embodiment is particularly preferred for ferroelectric materials, such a layered superlattice materials, when it is required or desired to isolate the capacitor dielectric 82 from the transistor 72 to prevent migration of atoms in the dielectric to the silicon of the transistor. Again, in FIG. 2, the portion of the integrated circuit 100 shown represents one DRAM memory cell 76 which includes a transistor 72 and a capacitor 80. Integrated circuit 100 includes a underlying substrate 71, preferably a single crystal silicon wafer, on which transistor 72 is formed. Transistor 72 comprises source/drain active areas 73A and 73B, formed by doping areas of underlying substrate 71, and gate 74. Integrated circuit 100 further includes field oxide areas 75, and first insulating layer 77 on which capacitor 80 is formed. First insulating layer 77 includes a gate oxide and a thermal oxide which, as is well-known, are formed in different steps but essentially merge because they are made of the same material. First insulating layer 77 further also may include other layers as described in U.S. Pat. No. 5,468,684 issued Nov. 21, 1995. Capacitor 80 includes first electrode 81, intermediate layer 82, which preferably is formed of a self-patterning material, and second electrode 84. Second insulating layer 86 overlies the capacitor 80, and wiring layer 88, often referred to as a metalization layer, connects the active area 73B with first electrode 81 of capacitor 80, and active area 73A and second electrode 84 with other portions of the circuit. Wiring layer 88 is preferably a multilayered structure including a layer 89, which layer is preferably made of platinum but preferably in the anneal process forms platinum silicide in the area 90 where it contacts the active areas 73A and 73B, a second layer 91, preferably made of titanium, and a third layer 93, preferably made of platinum, which contacts the surfaces 99 and 97 of capacitor electrodes 81 and 84 respectively. A capping layer 95, preferably phosphorous-doped SOG, completes the layered structure of the integrated circuit. Again, the invention particularly relates to a method of fabricating a capacitor 80, therefor the structure and method of fabrication of such a capacitor will be discussed in more detail below. The other portions may be fabricated as disclosed in U.S. Pat. No. 5,468,684 issued Nov. 21, 1995 or any other conventional manner. As is well-known, integrated circuits such as 10 and 100 are generally made on a wafer which is subsequently sawed into hundreds of individual integrated circuit chips, each chip containing thousands or millions of cells 12, 76. Each chip is then packaged to produce the finished integrated circuit.

In the discussions below, we shall discuss the method of the invention in terms of the DRAM/FERAM embodiment of FIG. 2, since this is the preferred embodiment of the DRAM/FERAM structure for most of the actual examples of self-patterning materials discussed herein. However, it should be understood that the invention contemplates that the method can also be used in combination with the DRAM/FERAM embodiment of FIG. 1 and many other integrated circuits, including, but not limited to, 2T/2C DRAMs/FERAMs. Further, it should be understood that the capacitor of FIG. 2 is a generalization useful to show the general relationship of the capacitor and its parts to the other parts of the integrated circuit, and, as will be shown in more detail below, that actual capacitors formed by the processing of the invention may have somewhat different structure depending on the details of the process. It should be understood that the term substrate is often used ambiguously in the art of integrated circuits. Often it is used to refer to the silicon, gallium arsenide or other wafer, such as 13 in FIG. 1 and 71 in FIG. 2, on which the integrated circuit is fabricated. We have referred to these as the "underlying substrates" above. At other times the term is used to refer to the incomplete portion of the integrated circuit on which a particular layer is formed. For example, in this sense, the "substrate" on which capacitor 80 in FIG. 2 is formed is in general terms the incomplete capacitor through layer 77. At still other times the word "substrate" is used to mean the immediate layer on which a material is formed. In this sense the layer 77 is the immediate substrate on which capacitor 80 is formed. In this specification, the term "substrate" is used broadly to mean any layer on another layer is formed. In particular, when a capacitor, such as 80 in FIG. 2, is being discussed, the "substrate" most immediately is the layer 77 and more generally layer 77 and the layers below it. When an active layer, such as the ferroelectric dielectric layer 82 in FIG. 2, is being discussed, then the "substrate" most immediately is the bottom electrode 81 and more generally bottom electrode 81 and all the layers of the incomplete integrated circuit below it.

The integrated circuit layer of most interest in this specification is the ferroelectric/dielectric layer, such as layer 32 in FIG. I and layer 82 in FIG. 2. We shall refer to this layer herein as an "active" layer in that it and electrodes, such as 81 and 84, form an electronic component the electronic state of which changes during operation of the integrated circuit. This is in contrast to layers such as passivation layer 95 which do not change electronic state during the operation of the integrated circuit.

Figure 3:
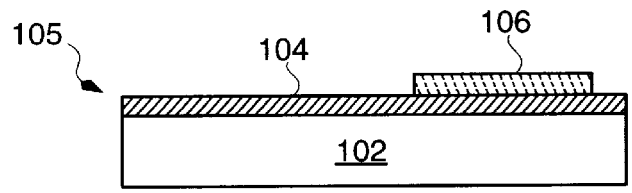
FIGS. 3–8 illustrate various stages in a lift-off method according to the invention of making a capacitor, which method may be utilized in making the DRAM of FIG. 2 according to the invention.
Figure 6:
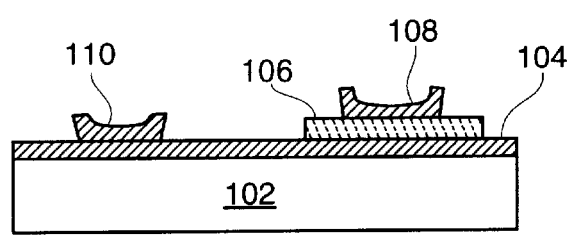
Figure 7:
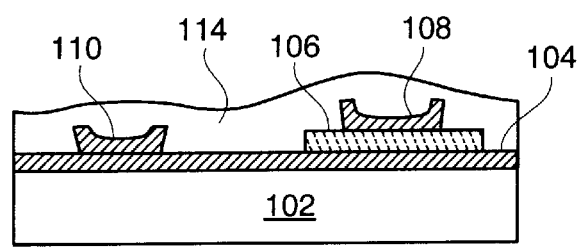
Figure 8:
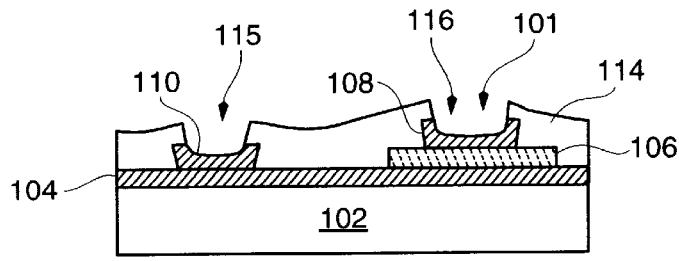

Turning to FIGS. 3–9, lift-off a process for forming a capacitor 101 (FIG. 6) on an insulating layer 102 is illustrated. Layer 102 may be considered to be a layer such as 77 in FIG. 2. In conventional integrated circuit fabrication, patterning using an etching process is more often preferred. However, as will be shown in more detail below, the lift-off process is preferred for use with self-patterned materials, particularly layered superlattice materials, because it protects the material from a direct etch. Referring to FIG. 8, the capacitor 101 includes a bottom electrode 104, a dielectric or ferroelectric material 106, and top electrode 108. A portion 110 of the metalization that connects the bottom electrode 104 to the rest of the integrated circuit, such as the integrated circuit 100 (FIG. 2), is also formed in this process. Referring to FIG. 3, bottom electrode 104 has been formed on insulator 102 to form a substrate 105 on which active layer 106 comprising a self-pattered material has been deposited and patterned. Insulator 102 is preferably a form of silicon dioxide, although it may also be another insulator or a wafer of silicon or gallium oxide or other integrated circuit substrate material. Bottom electrode 104 is preferably a layer of platinum about 2000 angstroms (Å) thickness, and is deposited by sputtering, but also may be include an adhesion layer of titanium of about 200 Å thick, or may be any other suitable conducting material or multiple layers of conducting materials. Bottom electrode 104 has been patterned, preferably by a conventional ion milling process, and the figure has been terminated beyond the patterning of the bottom electrode since the rest of the circuit is shown in FIG. 2 and is not of immediate concern.

Figure 43:
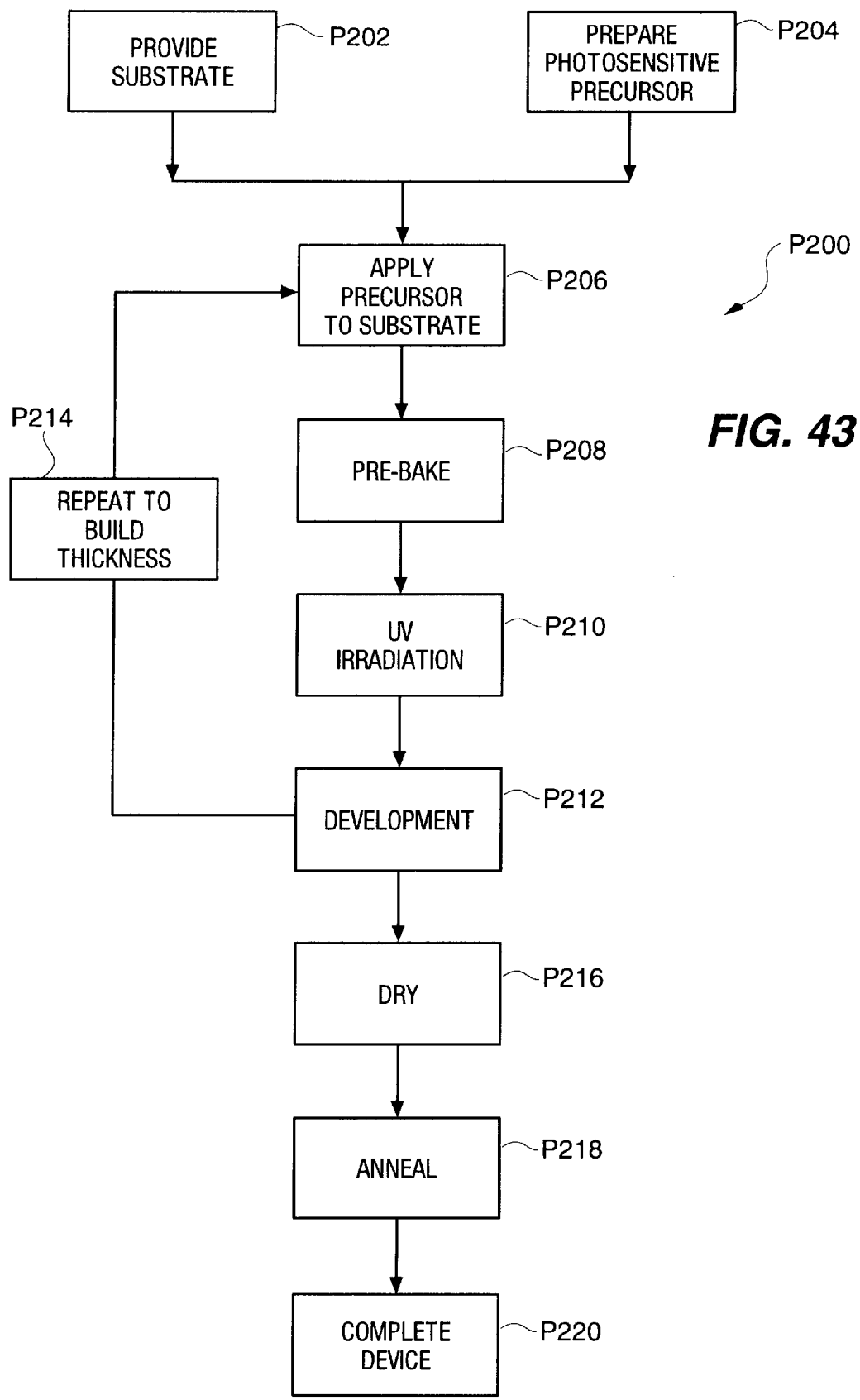
FIG. 43 is a flow chart showing the steps of the preferred process according to the invention.

Active layer 106 is preferably a thin film of strontium bismuth tantalate or other layered superlattice material. It also may be some other metal oxide, such as PZT. It is deposited as shown in FIG. 43. Step P202 includes providing substrate 105. As indicated above, substrate 105 may be an insulating layer such as 77 in FIG. 2, or any type of underlying integrated circuit substrate or optical substrate, together with any layers, such as 104, deposited on the substrate prior to the deposition of subsequent layers. Step P204 includes preparing a photosensitive liquid solution. The photosensitive liquid solution contains at least one photoreactive compound. The photosensitive solution may be: 1) a alkene monomer or plurality of alkene monomers each having a metal bonded to a free radical polymerizing agent and a free radical photo initiator dissolved in an organic solvent such as described in U.S. patent application Ser. No. 08/653,444 filed May 24, 1996; 2) a metal-alkoxide, metal acetylacetonate, and/or a metal carboxylate, a nitro compound, and a stabilizer as described in U.S. patent application Ser. No. 081570,576 filed Dec. 11, 1995; 3) an o-nitrobenzyl alcohol in a sol-gel solution as described in Soyama et al., *The Formation of a Fine-Patterned Ferroelectric Thin-Film From a Sol-Gel Solution Containing a Photo-Sensitive Water Generator*, Proceedings Of The International Symposium On Applied Ferroelectrics (1994); 4) an unsubstituted metal alkoxide with a stabilizing additive, such as described in U.S. patent application Ser. No. 08/570,576 filed Dec. 11, 1995. In each case the photosensitive solution contains a plurality of elements in appropriate amounts for forming a desired compound with a desired stoichiometry upon applying the solution to a substrate to form a thin film, exposure of the thin film to radiation, development of the thin film, and treating the film to form a solid material. The elements preferably include metals. Metals that are useful include transition metals, especially, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals, especially, cerium, praseodymium, neodymium, promethium, samarium, europium, gadolinium, terbium, dysprosium, holmium, erbium, thulium, ytterbium, and lutetium; the rare earth metals including calcium, strontium, barium, and radium; and the alkali metals including lithium, sodium, potassium, rubidium, cesium, and francium. Other metals for use in the present invention include magnesium, zinc, cadmium, aluminum, gallium, indium, thallium, germanium, lead, tin, antimony, and bismuth. Nonmetallic elements that are useful in materials incorporated into integrated circuits by the process of the invention include selenium, tellurium, phosphorous, silicon, and boron.

In the case of layered superlattice materials, the photosensitive solution is preferably either: 1) an alkene monomer or plurality of alkene monomers each having a metal bonded to a free radical polymerizing agent and a free radical photo initiator dissolved in an organic solvent such as described in U.S. patent application Ser. No. 08/653,444 filed May 24, 1996; or 2) a metal-alkoxide, metal acetylacetonate, and/or a metal carboxylate, a nitrocompound, and a stabilizer as described in U.S. patent application Ser. No. 08/570,576 filed Dec. 11, 1995.

Several examples of the preparation of a photosensitive solution are given below. The first two examples illustrate the formation of a photosensitive solution for making a layer 106 of strontium bismuth tantalate, a layered superlattice material. The third example illustrate the formation of a photosensitive solution for making a layer 106 of strontium bismuth tantalum niobate, another layered superlattice material.

EXAMPLE 1

The ingredients in Table 1 were purchased from the sources indicated, and measured in the amounts shown. The tantalum pentabutoxide, strontium diisopropoxide, and 25 ml methylmethacrylate were mixed with 20 ml of 2-methoxyethanol solvent in a 300 ml Erlenmeyer flask fitted with a distillation head. The reaction mixture was heated to 120° C. for twenty four hours with constant magnetic stirring to make an homogenous solution. The large excess amount of methylmethacrylate and the long reaction time with distillation to eliminate water and alcohol (isopropyl and butyl) byproducts drove the reaction substantially to completion. The reaction product included tantalum and strontium alkoxy acrylates, and was concentrated by vacuum evaporation at 120° C. at 10–30 mm Hg for one hour to remove about 15 ml of solution. The concentrated pre solution stood until it reached room temperature.

The bismuth triethoxide was dissolved in 20 ml of 2-methoxyethanol at room temperature in a 300 ml Erlenmeyer flask fitted with a distillation head. An 8.7 ml quantity of methylmethacrylate was added, and the mixture was reacted at 60–80° C. for twenty four hours with constant magnetic stirring. The reaction product contained a bismuth alkoxy acrylate, and was concentrated by vacuum evaporation at 60–80° C. at 10–30 mm Hg for one hour to remove about 15 ml of a solution. The concentrated pre solution stood until it reached room temperature.

TABLE 1

| Ingredient | Formula Weight (g/mol) | Grams | mmole | Vendor |
|---|---|---|---|---|
| strontium diisopropoxide | 205.80 | 2.09 | 10.16 | Strem |
| bismuth triethoxide | 344.16 | 9.33 | 27.11 | Vnipim |
| tantalum pentabutoxide | 546.52 | 12.35 | 22.60 | Vnipim |
| 1-hydroxy-cyclohexylphenylketone | 204.3 | 2.308 | 11.30 | Aldrich |
| methylmethacrylate | 100.12 | 23.5 (25 ml) | 235 | Aldrich |
| methylmethacrylate | 100.12 | 8.14 (8.7 ml) | 81.3 | Aldrich |

A photosensitive solution was prepared at room temperature by mixing the strontium and tantalum alkoxy acrylate pre solution with the bismuth alkoxy acrylate pre solution. The solution metals were present in proportions capable of yielding a metal oxide having the empirical formula $Sr_{0.852}Bi_{2.277}Ta_{1.893}O_9$. The pre formulation includes an approximate 14% excess bismuth amount and an approximate 2% excess tantalum amount as compared to the Smolenskii formula (I) below. These excess percentages account for anticipated metal volatilization losses in the anneal.

Thus, the solution was designed to yield a strontium bismuth tantalate metal oxide corresponding to the Smolenskii formula (I). The 1-hydroxycyclohexylphenylketone was added to the solution at room temperature, and 2-methoxyethanol was added to adjust the molarity of the solution to 0.12 mol per liter.

EXAMPLE 2

The ingredients shown in Table 2 were purchased from the sources indicated, and measured in the amounts shown.

TABLE 2

| Ingredient | Formula Weight (g/mol) | Grams | mmole | Vendor |
|---|---|---|---|---|
| strontium | 87.62 | 1.39 | 15.86 | Aldrich |
| bismuth triethoxide | 344.16 | 12.01 | 34.89 | Vnipim |
| tantalum n-butoxide | 546.56 | 17.34 | 31.72 | Vnipim |
| 2-nitrobenzaldehyde | 151.12 | 2.40 | 15.86 | Aldrich |
| 1,3-butanediol | 90.12 | 5.72 | 63.44 | Aldrich |

The strontium and tantalum n-butoxide were mixed with 90 grams of 2-methoxyethanol solvent in a 300 ml Erlenmeyer flask fitted with a distillation head. The mixture was heated to 100° C. for 30 minutes with constant magnetic stirring to make an homogeneous solution. After cooling down to room temperature, the bismuth triethoxide was dissolved in the solution. Then, a photosensitive solution was made by adding the 2-nitrobenzaldehyde and 1,3-butanediol to the solution and reacting. Finally, the solution was diluted with 2-methoxyethanol to adjust the concentration of the metal oxide component in the solution to 0.12 mol per liter. The stoichiometry of the metal oxide formed from this solution was $SrBi_{22}Ta_2O_{9.3}$.

EXAMPLE 3

The ingredients shown in Table 3 were purchased from the sources indicated, and measured in the amounts shown.

The tantalum pentabutoxide, niobium pentabutoxide, strontium methoxypropoxide, and 25 ml 2-ethyl-2-hexenoic acid were mixed with 20 ml of 2-methoxyethanol solvent in a 300 ml Erlenmeyer flask fitted with a distillation head. The reaction mixture was heated to 120° C. for twenty four hours with constant magnetic stirring to make a homogenous solution. The large excess amount of 2-ethyl-2-hexenoic acid and the long reaction time with distillation to eliminate water and alcohol byproducts drove the reaction substantially to completion. The reaction product included tantalum, niobium, and strontium alkoxy acrylates, and was concentrated by vacuum evaporation at 120° C. and 10–30 mm Hg for 1.5 hours to remove about 15 ml of solution. The concentrated pre solution stood until it reached room temperature.

TABLE 3

| Ingredient | Formula Weight (g/mol) | Grams | mmole | Vendor |
|---|---|---|---|---|
| strontium ethoxypropoxide | 205.80 | 3.03 | 10.17 | Strem |
| bismuth tri-t-pentoxide | 470.39 | 12.76 | 27.12 | Gelest |
| tantalum pentabutoxide | 546.52 | 7.41 | 13.56 | Vnipim |
| niobium pentabutoxide | 458.12 | 4.14 | 9.04 | Vinipim |
| 2,2 dimethoxy-2-phenylacetophenone | 256.3 | 2.90 | 11.30 | Aldrich |
| 2-ethyl-2-hexenoic acid | 142.20 | (33.25 ml) | 233.8 | Aldrich |
| 2-ethyl-2-hexenoic acid | 142.20 | (33.25 ml) | 80.2 | Aldrich |

The bismuth tri-t-pentoxide was dissolved in 20 ml of 2-methoxyethanol at room temperature in a 300 ml Erlenmeyer flask fitted with a distillation head. A 25 ml quantity of 2-ethyl-2-hexenoic acid was added, and the mixture was reacted at 60–80° C. for twenty four hours with constant magnetic stirring. The reaction product contained a bismuth alkoxy acrylate, and was concentrated by vacuum evaporation at 60–80° C. and 10–30 mm Hg for 1.5 hours to remove about 15 ml of solution. The concentrated pre solution stood until it reached room temperature.

A photosensitive solution was prepared at room temperature by mixing the tantalum, niobium, and strontium alkoxy acrylate pre solution with the bismuth alkoxy acrylate pre solution. The solution metals were present in proportions capable of yielding a metal oxide having the empirical formula $Sr_{0.053}Bi_{2.274}Ta_{1.137}Nb_{0.758}O_9$. The pre formulation includes an approximate 14% excess bismuth amount and an approximate 2% excess B-site metal amount as compared to Formula (3) above. The B-site metals are split between tantalum (60%) and niobium (40%). These excess percentages account for anticipated metal volatilization losses in the anneal. Thus, the solution was designed to yield a strontium bismuth niobium tantalate metal oxide corresponding to the Smolenskii formula (1) below. The 2,2 dimethoxy-2-phenylacetophenone was added to the solution at room temperature, and n-octane was added to adjust the molarity of the solution to 0.12 mol per liter.

In step P206, the photosensitive liquid solution of step P204 is applied to the substrate 105 of step P202. The preferred form of deposition is spin-on deposition in which a few drops of the photosensitive liquid solution from step P204 are applied to form a thin film of the liquid. The substrate is subsequently spun at about 600 rpm to 3000 rpm for thirty seconds to yield the uniform film. The most preferred rotational velocity is 1500 rpm. Other liquid deposition techniques, e.g., misted deposition techniques as described in U.S. Pat. No. 5,456,945 issued Oct. 10, 1995 can also be used to deposit the liquid solution. In step P208, the spun-on film is subjected to a pre-bake on a hot plate in air at a temperature ranging from 80° C. to 150° C. for one to three minutes. The most preferred pre-baking conditions are 100° C. for one minute. This prebaking step stabilizes the film for use in subsequent steps, and is also referred to as a soft-bake because the resultant film is amorphous and contains the above-described compounds in substantially unpolymerized form.

Step P210 includes exposing the dried film from step P208 to ultraviolet radiation. Prior to such exposure, a mask is aligned with substrate 105 using a conventional contact aligner. Deep ultraviolet radiation having a wavelength ranging from 250 nm to 300 nm is preferred, as is a total energy delivery of at least about 500 mili-Joules during the term of exposure. The radiation wavelength and energy delivery may be varied, as required for interaction with a selected photosensitive solution. The ultraviolet radiation initiates a polymerization reaction which gels or hardens the film in the areas exposed to radiation. Step P212 includes developing the selectively polymerized film by washing or rinsing the wafer with a developer solution to remove unpolymerized portions of film. The developer solution for each of the four photosensitive solutions described above are disclosed in the respective references.

In step P214, steps P206–P210 are optionally repeated until the thin film has reached a desired thickness. Care must be taken when aligning the mask with the substrate 105 each time in step P210, because significant mask alignment error causes misalignment between the newly deposited film and the underlying film. In steps P216 and P218 the developed film is treated to form a solid film of the desired metal oxide. Treating may include exposure to vacuum or ultraviolet radiation, drying, and heating, including baking and annealing. Preferably treating includes a drying step P216 and an annealing step P218. In the drying step the patterned film on the substrate 105 is typically placed on a hot plate in air and dried at a temperature ranging from 100° to about 300° C. for a time ranging from ten seconds to five minutes. The most preferred drying procedure is a multi-staged drying procedure. For example, the substrate 105 bearing the patterned film is placed on a 140° C. hot plate for one minute followed by 260° C. for four minutes. The final drying step may include a brief exposure to rapid thermal processing apparatus, for example, heating a 725° C. for thirty seconds under an oxygen flow of 5 cc/minute.

In step P218, substrate 105 bearing the patterned film is furnace annealed, preferably at a temperature ranging from 600° to 850° C. for from thirty minutes to two hours. The most preferred anneal profile is 800° C. under an oxygen flow for one hour. Layer 106 is preferably between about 1000 Å and 3000 Å thick, most preferably about 1500 Å thick.

Step P220 includes completing the integrated circuit device. This completing step entails the deposition of additional layers together with the removal or patterning of the additional material, as required. For example, in the preferred embodiment of FIG. 2, the layer 106 is a ferroelectric capacitor in an integrated circuit non-volatile memory and the completing step includes adding an insulating layer 86, the metalization layers 88, and the passivation layer 95; in other embodiments it may be the dielectric layer of a capacitor in a DRAM memory, the gate of a ferroelectric transistor etc. and the completing step will be the completion of those particular integrated circuits.

In the preferred embodiment the material 106 is a ferroelectric layered superlattice material. Layered superlattice materials are described in detail in U.S. Pat. No. 5,423,285 issued Jun. 13, 1995 and U.S. Pat. No. 5,519,234 issued May 21, 1996. In general, a layered superlattice material is defined as a material that can be described by a single chemical formula and which spontaneously forms itself into alternating layers having distinctly different crystalline structure. For example, strontium bismuth tantalate can be considered to be formed of alternating layers of a crystal structure similar to $Bi_2O_3$ and a crystal structure similar to $SrTa_2O_6$ although it must be kept in mind that $SrTa_2O_6$ has a tungsten bronze structure by itself, but within the layered material it has a perovskite structure. Thus the layered structure is in reality a superlattice in which the structures of the individual sublattices of the perovskite layers and the non-perovskite layers are interdependent. These layered materials are natural superlattices, as compared to other superlattices, such as compositional superlattices, which are manufactured or forced superlattices. Thus, the term "layered superlattice material" is selected to distinguish these superlattice materials from alloy type superlattice materials, which are not layered, and superlattice heterostructures, i.e. the compositional superlattices, which are inherently not a "material" but rather layered structures made of at least two different materials having different chemical formulae.

The layered superlattice materials made by the process of the invention are polycrystalline. In the polycrystalline state, the structure of the materials includes grain boundaries, point defects, dislocation loops and other microstructure defects. However, within each grain, the structure is predominately repeatable units containing one or more ferroelectric layers and one or more intermediate non-ferroelectric layers spontaneously linked in an interdependent manner. Thus the layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and those that include perovskite-like layers can be included in the following definition: (B) a material having a localized structure, within a grain or other larger or smaller unit, which localized structure contains predominately repeatable units containing one or more perovskite-like layers and one or more intermediate non-perovskite-like layers spontaneously linked in an interdependent manner.

The layered superlattice materials include layered perovskite-like materials catalogued by Smolenskii et al. in *Ferroelectrics and Related Materials*, ISSN 0275-9608, (V.3 of the series Ferroelectrics and Related Phenomena, 1984) edited by G. A. Smolenskii, Sections 15.3–15.7 and include:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4T_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2b_4O_{20}$. It is noted that in the case of $Sr_2Nb_2O_7$ and $La_2Ti_2O_7$ the formula needs to be doubled to make them agree with the general formula. Layered superlattice materials include all of the above materials plus combinations and solid solutions of these materials.

Layered superlattice materials may be summarized more generally under the formula:

$$A1_{w1}^{+a1} A2_{w2}^{+a2} \ldots aj_{wj}^{+aj} S1_{x1}^{+s1} S2_{x2}^{+s2} \ldots Sk_{xk}^{+sk} B_{y1}^{+b1} B2_{y2}^{+b2} \ldots B1_{y1}^{+b1} Q_z^{-2}, \quad (1)$$

where A1, A2 . . . Aj represent A-site elements in the perovskite-like structure, which may be elements such as strontium, calcium, barium, bismuth, cadmium, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{.75}Ba_{.25}Bi_2Ta_2O_9$, on the average, 75% of the time Sr is the A-site atom and 25% of the time Ba is the A-site atom. If there is only one A-site element in the compound then it is represented by the "A1" element and $w2 \ldots wj$ all equal zero. If there is only one B-site element in the compound, then it is represented by the "B1" element, and $y2 \ldots yl$ all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2 \ldots +ajwj)+(s1x1+s2x2 \ldots +skxk)+(b1y1+b2y2 \ldots +bjyj)=2z. \quad (2)$$

Formula (1) includes all three of the Smolenskii type compounds: for the type I material, $w1=m-1$, $x1=2$, $y1=m$, $z=3m+3$ and the other subscripts equal zero; for the type 11 material, $w1=m+1$, $y1=m$, $z=3m+1$, and the other subscripts equal zero; for the type III material, $w1=m$, $y1=m$, $z=3m+2$, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials. Terms of art that have been applied to these structures include layered perovskite-like materials, recurrent intergrowth layers, Aurivilius materials, and self-orienting spontaneous intergrowth layers. Even so, no one single term suffices to describe the entire class of layered superlattice materials. Applicants have chosen the term "layered superlattice materials" to describe the entire class of materials because the lattices include a short range order, e.g., a sublayer formed of a perovskite-like oxygen octahedra lattice, and a long range order including a periodic repetition of sublayers, e.g., a perovskite-like sublayer and a superlattice generator metal oxide layer repeated in succession. Further, as in other superlattice materials, the length of the periodicity can be manipulated. For example, as is known in the art of these materials, by adjusting the stoichiometry, the value of "m" in the Smolenskii formulas I, II, and III above can be varied to vary the thickness of the perovskite-like layers. See, *Ferroelectrics and Related Materials*, ISSN 0275-9608, (V.3 of the series Ferroelectrics and Related Phenomena, 1984) edited by G. A. Smolenskii, p. 694. The dual order of these periodically repeating structures and the ability to manipulate the periodic distances meets the definition of a superlattice. As indicated above, the term "layered superlattice material" should not be confused with forced heterolattice structures that are made by sputter deposition of successive layers. Layered superlattice materials spontaneously form collated intergrowth layers in an anneal, and do not require the forced deposition of successive layers.

Figure 4:
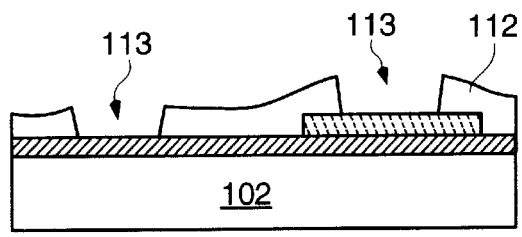
Figure 5:
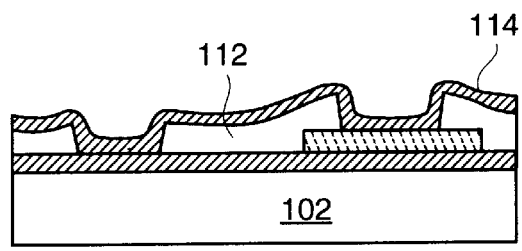

Returning now to the fabrication process of FIGS. 3–8, in FIG. 4 a resist layer 112 has been deposited and pattern by conventional mask, photo, develop, and etch processes known in the art. It should be noted that the solvent used to develop the resist is typically xylenes, n-butyl acetate, methanol, or other such organic liquids. These liquids are much less damaging any metal oxide, particularly the layered superlattice materials, such as $SrBi_2Ta_2O_9$, than the acids used in etches. Then, in FIG. 5 another electrode layer 114 is deposited. Layer 114 is preferably about 2000 Å of sputtered platinum, but may also be other suitable conductors, or multiple layers of various conductors, such as titanium and platinum. Optionally, a conventional ion milling step may follow to pattern top electrode 108 and metalization portion 110. Resist layer 112 is then stripped by conventional methods known in the art, taking the platinum above it with it, to leave top electrode 108 and metalization portion 110 as shown in FIG. 6. Again, the stripping agents are solvents, such as xylenes, n-butyl acetate, and methanol, which are relatively benign to the layer 106. Then, as indicated in FIG. 7, a layer 114 of an interlayer dielectric (ILD), which may be any suitable insulator but is preferably SOG, is deposited. As shown in FIG. 8, $SiO_2$ holes 115 and 116 are then opened to the top electrode 198 and metalization 110 by a conventional photo resist, mask, and etch process. The integrated circuit is then completed by steps discussed in the references given above. A review of the process just described shows that the capacitor 101 has been fabricated without exposing the material 106 to an etch. As is known in the art, the rest of the IC fabrication process usually begins with the deposition of an interlayer dielectric (ILD) 114, or, in terms of FIG. 2, such as 86, which together with the platinum 108, 110, protects the material 106 from any subsequent processing. Thus, in the entire fabrication process, the only direct exposure of the material 106 is to the relatively benign resist solvents. The process just described can be used in combination with any of the processes below to fabricate an integrated circuit.

Figure 9:
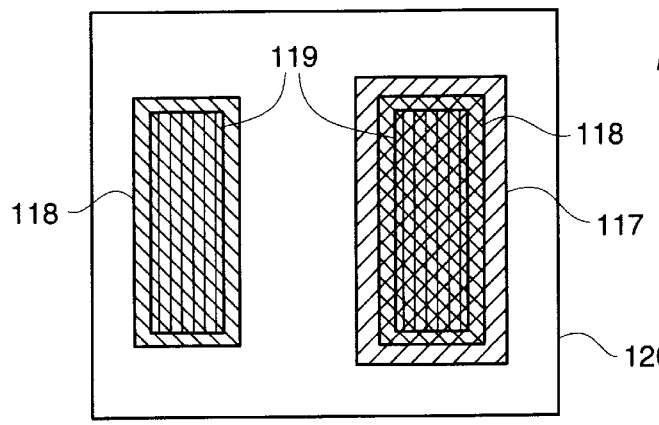
FIG. 9 is a layout of the masks used in fabrication of the capacitor of FIG. 8.

FIG. 9 is an overlay as known in the art showing the mask dimensions of the various masks used in the method of FIGS. 3–8 superimposed on substrate 105. The boundary 117 is the shape of the mask used in the self-patterning step P210 (FIG. 43), the boundary 118 is the mask used for open the holes 113 in resist 112 which define the top electrode 108 and metalization portion 110, the boundary 119 is the mask used to open the holes in the ILD 114, and the outer boundary 120 is the mask used to define the bottom electrode 104.

Figure 10:
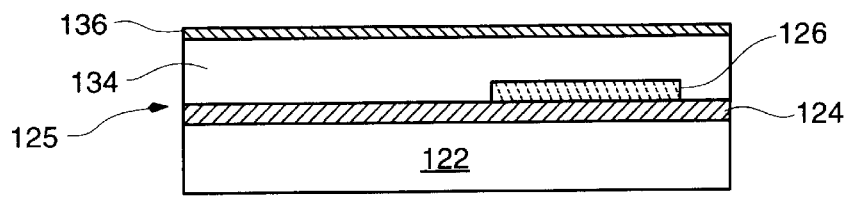
FIGS. 10–16 illustrate various stages in an alternative lift-off method according to the invention of making a capacitor, which method may be utilized in making the DRAM of FIG. 2.
Figure 11:
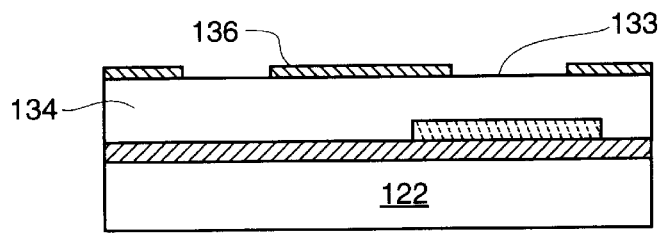
Figure 12:
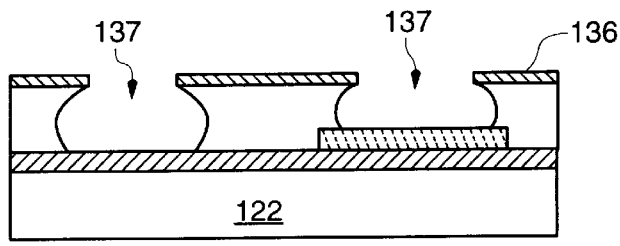
Figure 13:
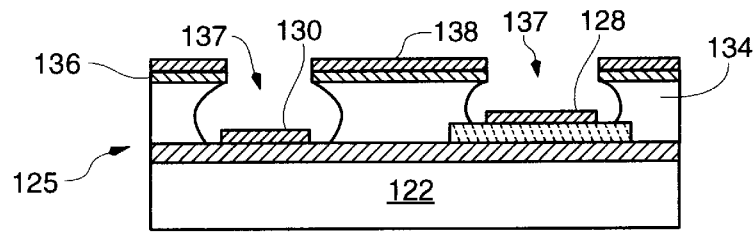
Figure 14:
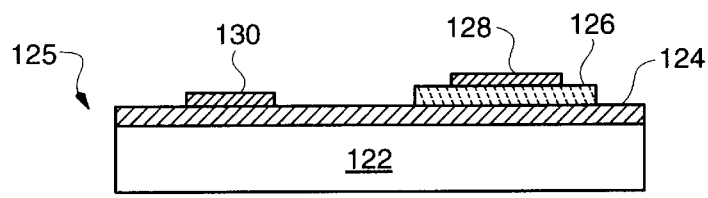
Figure 15:
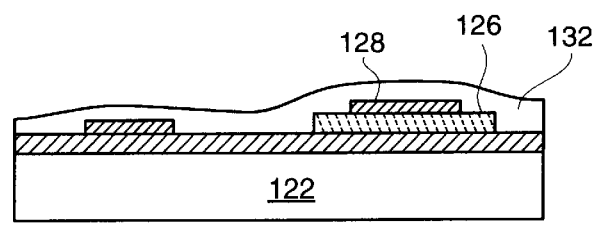
Figure 16:
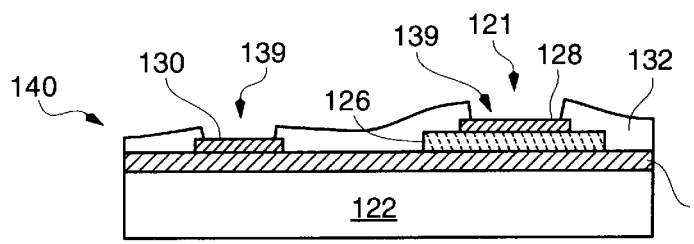
Figure 17:
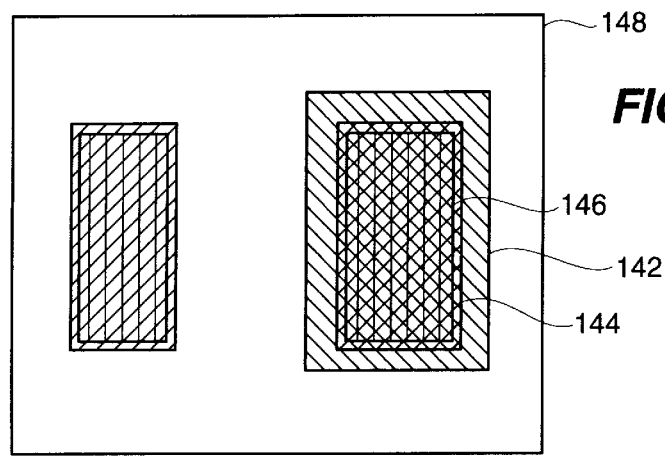
FIG. 17 is a layout of the masks used in the fabrication of the capacitor of FIG. 16.

Turning now to FIGS. 10 through 16 another lift-off process is shown according to the invention. Again, this process can be used in combination with the process discussed above and any of the other processes discussed below to fabricate an integrated circuit. And again, it results in the active material 108 being exposed only to relatively benign processing during the entire IC fabrication process. Referring to FIG. 16, this process results in a capacitor 121 comprising bottom electrode 124, ferroelectric/dielectric layer 126, and top electrode 128, plus metalization portion 130 with an interlayer dielectric 132 deposited before completing the rest of the integrated circuit. In FIG. 10 a bottom electrode 124 and a self-patterned ferroelectric/dielectric layer 126 have been deposited and patterned on an insulating layer 122 to form a substrate 125 as discussed above with respect to FIG. 3. In addition a resist layer 134 has been deposited plus an expendable layer 136 that typically will be aluminum, but may also be silicon dioxide, silicon nitride and other materials that may be used to provide a mask resistant to the solvent or solvents that dissolve resist 134. Then, in FIG. 11, the layer 136 has been patterned in a conventional process of depositing another resist layer, followed by mask, photo, develop, and etch steps followed by a resist strip to open mask holes 133. Then, in FIG. 12 an isotropic resist etch has been performed to open holes 137. Again, this etch is done with solvents, such as xylenes, n-butyl acetate, and methanol, that are relatively benign to the material 134. As indicated in FIGS. 12 and 13, this etch tends to expand the holes 137 beyond the edges of the aluminum mask 136, which is beneficial in obtaining a top electrode that spans the full width and more of the mask holes 133. In FIG. 13 a layer 138 of platinum or titanium/platinum has been deposited which forms electrode 128 and metalization portion 130 in the holes 137. Then, in FIG. 14, the resist layer 134 has been stripped, which also strips away the layers 136 and 138 on top of it, again with the solvents that are relatively benign to layer 126. In FIG. 15, an interlayer dielectric (ILD) insulating layer 132 has been deposited, which preferably is spin-on-glass (SOG) but may also be some other form of silicon dioxide, silicon nitride, or other suitable insulator. Then, in FIG. 16 a further resist deposition, mask, photo, develop, etch and strip process has been performed to form holes 139 in ILD 132, leaving the circuit portion 140 ready for metalization and capping. In these steps, the platinum 128 protects the active material 126 from damage. FIG. 17 is an overlay showing the mask dimensions 142, 144, and 146 that were used to form the self-patterned ferroelectric/dielectric layer 126, the mask used to form the holes 133 in the aluminum mask 133 which eventually defines the top electrode 128 and metalization portion 130, and the mask used to define the $SiO_2$ holes 139. Again, outer boundary 148 represents the mask used to form bottom electrode 124. In summary, prior to the fabrication stage shown in FIG. 15, the active material 126 is not exposed to any harsh processing steps, such as acid etches. Beginning with and subsequent to the stage shown in FIG. 15, the active material 126 is protected from contact with any IC processing materials by platinum electrode 126 and ILD 132. Thus, the process of FIGS. 10–17 is designed to protect the active layer 126 from harsh conventional IC processing through the entire IC fabrication process.

Figure 18:
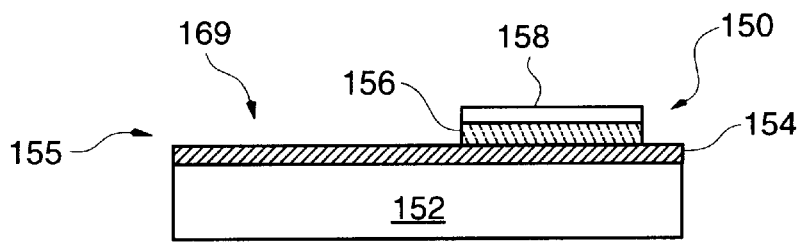
FIGS. 18–22 illustrate various stages in a method according to the invention of making a capacitor utilizing a SOG wet etching step, which method may be utilized in making the DRAM of FIG. 2.

Turning now to FIGS. 18 through 22, an alternative process that includes an SOG wet-etching step contacting the self-patterned layers 150 is illustrated. This process can be used in combination with any of the processes discussed above or below to fabricate an integrated circuit. In FIG. 18 a bottom electrode and a self-patterned material 150 have been formed and patterned on insulator 152 to form a substrate 155 by a process as discussed above in relation to FIG. 3, except that in the steps P206 through P214, two different layers 156 and 158 of self-patterning material 150 have been deposited. The first layer 156 is formed of the desired ferroelectric/dielectric material, and the second layer 158 is formed of a material that is reduced by the $SiO_2$ etchant to yield the desired material. For example, this process preferably comprises applying, pre-baking, UV irradiating, and developing one or more layers of strontium bismuth tantalate, in steps P206–P214, then drying and baking it preferably on a hot plate at between 100° and 300° C. for between 30 seconds and five minutes, preferably in a two step drying process as described above with respect to step P216, and then annealed as described above with respect to step P218, preferably at a temperature ranging from 600° to 850° C. for from thirty minutes to two hours. As indicated above, the most preferred anneal profile is 800° C. under an oxygen flow for one hour. Then a protective layer of bismuth-excess strontium bismuth tantalate or bismuth oxide ($Bi_2O_3$) is deposited, patterned, dried, and annealed also according to the process of steps P206–P218 of FIG. 43, with the same preferred drying and annealing profiles. The photosensitive solution for the bismuth oxide is prepared from the bismuth triethoxide solution as described above for the bismuth alkoxy acrylate pre solution, and then adding the 1-hydroxy-cyclohexylphenylketone and 2-methoxyethanol, also as described above. Likewise, if an excess bismuth strontium bismuth tantalate protective layer is used, then the photosensitive solution is prepared as described above for strontium bismuth tantalate, except that an appropriate additional amount of the bismuth pre solution is used. Alternatively, the strontium bismuth tantalate 156 may be deposited and patterned as described in steps P206–P214, then, in the last repetition of steps P206–P212, depositing, applying, pre-baking, irradiating, and developing the protective layer of bismuth-excess strontium bismuth tantalate or bismuth oxide ($Bi_2O_3$). The two layers 158 and 156 on wafer 169 are then dried and annealed together as described above with respect to steps P216 and P218. Another alternative is that layer 156 is fabricated through drying step P216, then layer 158 is fabricated through drying step P216, and then both layers 156 and 158 are annealed together.

Figure 19:
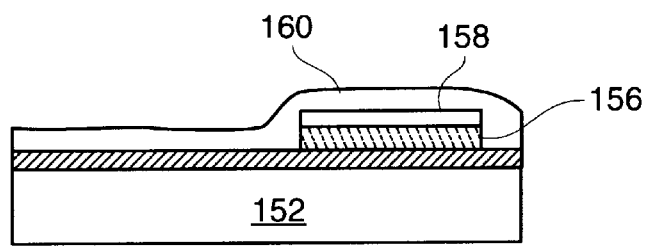
Figure 20:
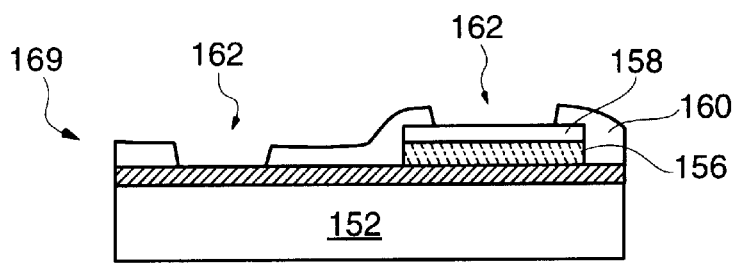
Figure 21:
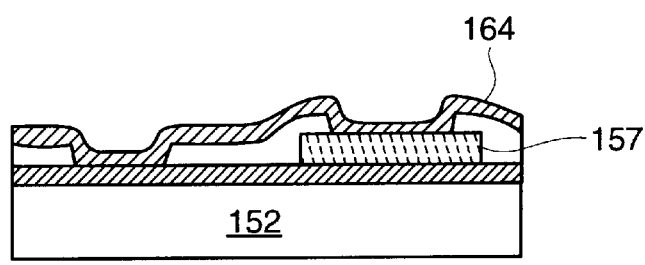
Figure 22:
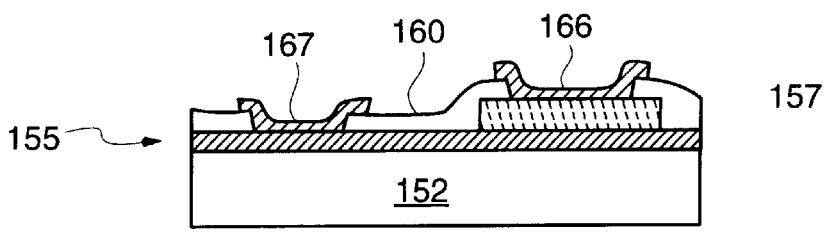

In FIG. 19 a layer 160 of SOG or other form of silicon dioxide has been deposited by a suitable conventional method. Layer 160 could also be other suitable insulators to which etches or other reduction processes are used to pattern. A conventional resist deposition, mask, photo, develop, etch and strip process is then used to produce the result of FIG. 20. As is known in the art, an etchant with high selectivity to $SiO_2$ is used. Preferably a wet etch with HF and $NH_4F$ is used, such as 1 HF (49%)+6 $NH_4F$ (40%). Plasma etches such as $CHF_3$, $CF_4+O_2$, or $CF_4$, $+H_2$ could also be used. In this etch step, protective layer 158 protects the active layer 156 from being damaged by the etchant. In FIG. 20, the layer 158 has been reduced by the etch to a bismuth rich material, which is not crystalline but will contain portions of strontium bismuth tantalate, portions of bismuth oxide, portions of bismuth, and perhaps other bismuth compounds. The wafer 169 is then annealed at between 600° C. and 850° C. for 5 minutes to 90 minutes, and preferably at about 800° C. for one hour. In this anneal any remaining portions of layer 158 are either vaporized as bismuth oxide or are integrated into the crystal structure of the film 156 which crystallizes into a layer 157 of solid strontium bismuth tantalate. If the layer 157 is to be a material other than strontium bismuth tantalate, then the protective layer 158 is selected to be an appropriate material that will protect the layer 156 during the etch, either be reduced by the etch, evaporated by the anneal, and/or integrated in to the layer 156 in the anneal, preferably all three. After the anneal, a top electrode layer 164 is deposited. Layer 164 is preferably about 2000 Å of sputtered platinum, but may also be other suitable conductors, or multiple layers of various conductors, such as titanium and platinum. Then follows conventional resist, mask, develop, ion milling, and resist strip steps to pattern top electrode 166 and metalization portion 167. In this process, the mask layout is essentially the same as that shown in FIG. 9. In a variation of the process of FIGS. 18–22, the anneals of the layers 156 and 158 prior to the deposition and patterning of ILD 160 may be skipped, and thus a solid, crystalline, active material 157 is not formed until the final anneal subsequent to the etch of ILD 160. Each of the processes and variations of processes just described with respect to FIGS. 18–22 prevent the conventional etch processes used with silicon oxide ILDs from harming the self-patterning materials.

Figure 23:
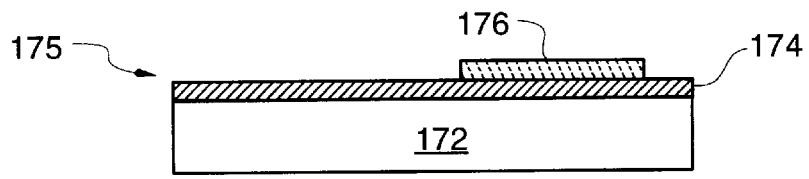
FIGS. 23–27 illustrate various stages in a method according to the invention of making a capacitor utilizing a self-patterning SOG, which method may be utilized in making the DRAM of FIG. 2.
Figure 24:
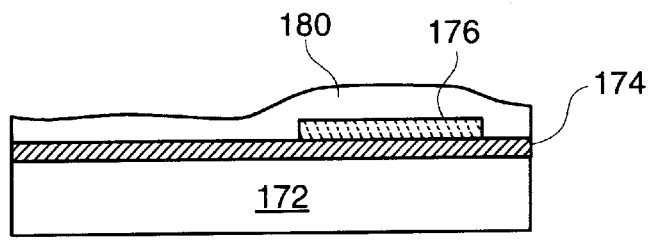
Figure 25:
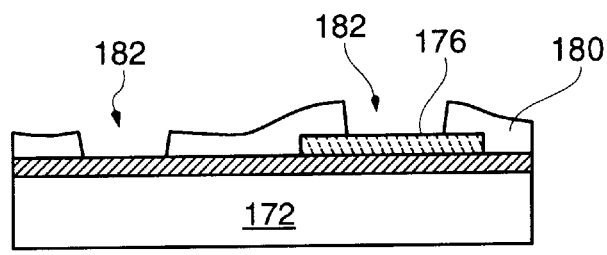
Figure 26:
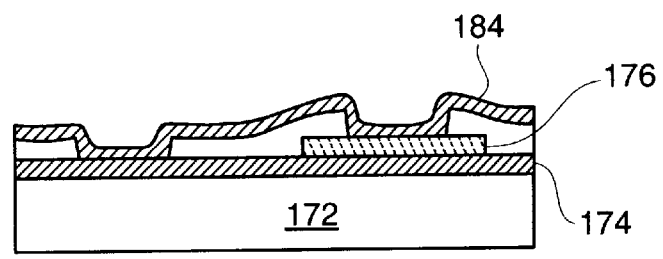
Figure 27:
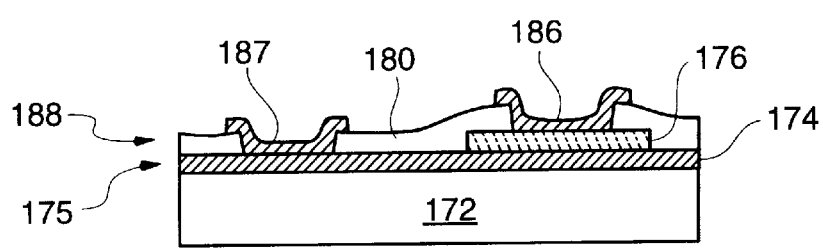

Turning now to FIGS. 23 through 27, there is shown a variation of the process just described, which variation uses a self patterning SOG, polymide, or polysilane to avoid harm to the self-patterning metal oxide. As with the other processes described herein, this process can be used in combination with any of the processes described above or below to fabricate and integrated circuit. In FIG. 23 an active ferroelectric/dielectric layer 176 has been deposited and patterned on a substrate 175 including an insulator 172 and bottom electrode 174 as discussed in reference to FIG. 3 and steps P206 through P214 in FIG. 43. Then, in FIG. 24 a layer of self-patterning insulator 180 has been deposited. The insulator 180 is preferably photo-sensitive SOG, put also may be a photosensitive polymide, polysilane, or other photosensitive insulator. The photosensitive SOG solution described in extended abstracts (The 39th Spring Meeting, 1992) 28a-N.B-7, The Japan Society of Applied Physics and Related Societies, may be used. If a photopolymide is used, a process as described in the Proceedings of the 2nd SPE International Conference on Polymides, Ellenville, N.Y., October–November, 1985, may be used. If a photosensitive polysilane is used a process as described in the Proceedings of the SPIE, 469,16 (1984) may be used. Alternatively, any of the four types of photosensitive solutions described above may be used with appropriate amounts of silicon, polymide or polysilane in the solutions as described in the references given above. The photosensitive SOG or other solution is deposited by spin deposition as described above, pre-baked, masked, exposed to UV radiation, and developed as described in reference to FIG. 43 to produce the silicon holes 182. Preferably the development solvent is 2-methoxyethanol, isopropyl alcohol (IPA) or other appropriate solvent. These solvents do not harm the already developed ferroelectric(dielectric 176 film. Thus, this process also protects the layer 176 from a harsh etch, such as hydrofloric acid. The ferroelectric/dielectric layer 176 and the SOG are then dried and annealed as described with respect to steps P216 and P218 in FIG. 43. Alternatively, the ferroelectric/dielectric layer 176 may be completed through the drying step P216, or through the drying and anneal steps P216 and P218, before deposition of the SOG or other insulator. The subsequent steps of deposition of the top electrode layer 184 and the patterning of top electrode 186 and metalization portion 187 are the same as the steps described in relation to FIGS. 21 and 22, and the masks are the same also, and thus will not be repeated. After the deposition of layer 184, the active layer 176 is completely enclosed by the substrate 188 on which it was formed, i.e. bottom electrode 174 and dielectric 172, and ILD 180, and top electrode 186, and therefore is protected from any harsh IC processing steps. Thus, the process of FIGS. 18–22 also ensures that the active layer 176 is never exposed to harsh conventional IC processing steps throughout the entire fabrication process.

Turning to FIGS. 28–34 a process in which the self-patterned active ferroelectric/dielectric layer 256 (FIG. 30) is formed in an $SiO_2$ hole 253 (FIG. 28) is illustrated. This process can be used in combination with any of the other processes discussed herein to fabricate an integrated circuit.

Figure 28:
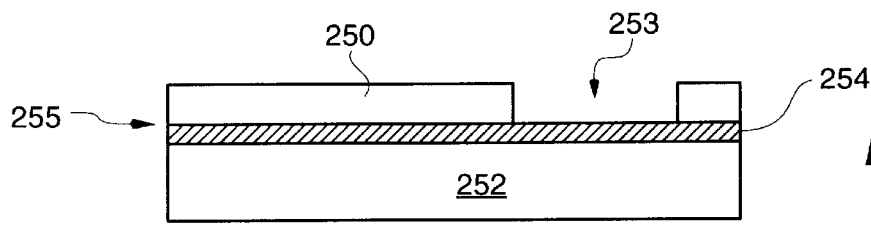
FIGS. 28–34 illustrate various stages in a method according to the invention of making a capacitor utilizing a self-patterning material in an $SO_2$ hole, which method may be utilized in making the DRAM of FIG. 2.
Figure 29:
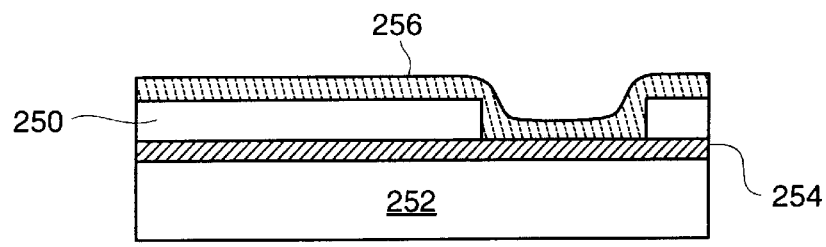
Figure 30:
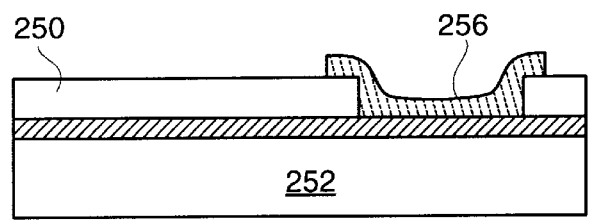
Figure 31:
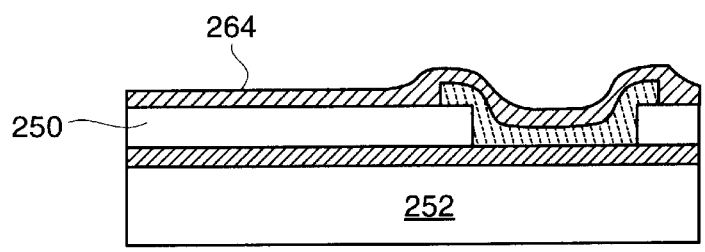
Figure 32:
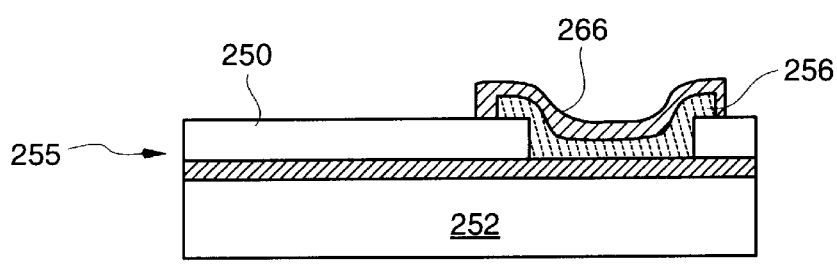
Figure 33:
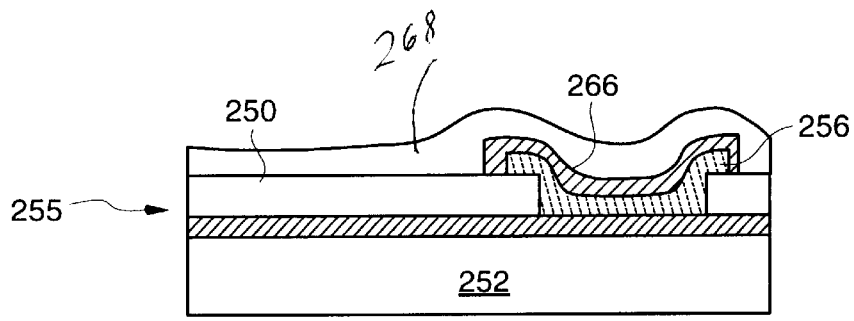
Figure 34:
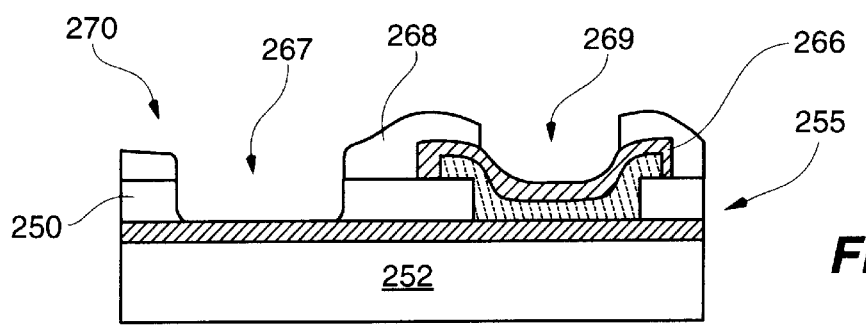

In FIG. 28 a bottom electrode 254 has been formed and patterned on an insulator 252 to form a substrate 255 as described with reference to FIG. 3 above, followed by the deposition of an ILD layer 250. Layer 250 is preferably SOG, but also may be other forms of silicon dioxide, silicon nitride, or other suitable insulator. It is formed by any conventional method of making such material. An "$SiO_2$ hole" 253, which in the art is terminology for a hole in an insulator, is formed in the insulator 250. Then a photosensitive ferroelectric/dielectric layer 256 is deposited as described above with respect to step P206 in FIG. 43 to obtain the result of FIG. 29. As indicated above, the material 256 was preferably strontium bismuth tantalate, but may be other layered superlattice materials or metal oxides. The layer 256 is then patterned as described with respect to steps P208–P214 in FIG. 43, then dried and annealed as described with respect to steps P216 and P218 in FIG. 43. Then a layer 264 of platinum, platinum/titanium, or other suitable top electrode material, preferably about 2000 Å of platinum, is deposited, preferably by sputtering as shown in FIG. 31. Then the layer 264 is patterned by a conventional resist, mask, photo, develop, ion milling, and strip steps to form the top electrode 266, as shown in FIG. 32. Then, a silicon dioxide or other insulator layer 268, preferably SOG, is deposited as indicated in FIG. 33. Holes 267 and 269 are then formed in insulator layers 268 and 250, preferably by a wet etch with HF and $NH_4F$, but which could be formed by other suitable etch process, to yield the wafer 270 as shown in FIG. 34. As in the other examples given above, the integrated circuit 270 is then preferably completed as shown and discussed with respect to FIG. 2. The mask overlay horizontal dimensions may be derived from the above FIGS. 28–34; the vertical size of the mask elements are as essentially as shown in FIGS. 9 and 17 for corresponding elements, i.e. the mask for the hole 269 is nested within the mask for the ferroelectric/dielectric material 256, which is nested within the mask for the top electrode 266.

A review of the above process shows it also avoids any exposure of active layer 256 to harsh IC fabrication processes. The $SiO_2$ etch is performed prior to the deposition of layer 256. Immediately after the formation of active layer 256, top electrode 266 is formed so that active layer 256 is completely enclosed by substrate 255, ILD 250 and platinum top electrode 266. Therefor it is not directly exposed to any subsequent IC processes.

Figure 35:
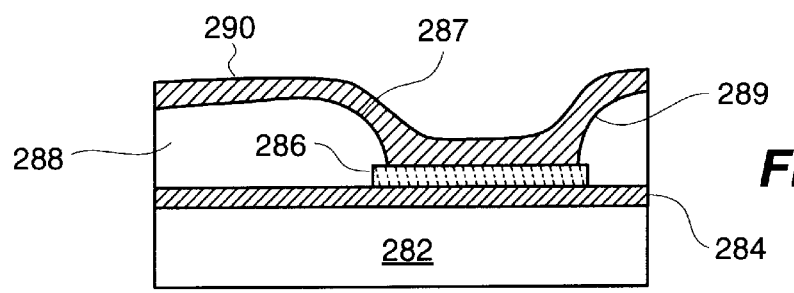
FIGS. 35 and 36 illustrate a chemical mechanical polishing process that may be used in combination with several of the processes illustrated in the above FIGS.
Figure 36:
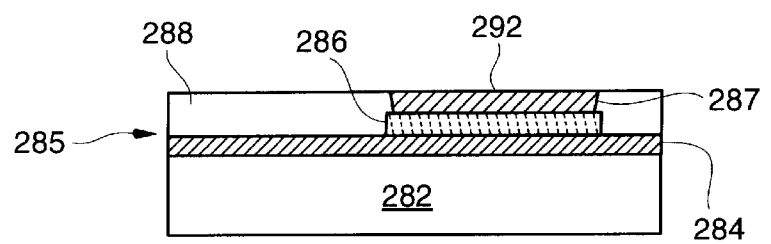

In FIGS. 35 and 36 a chemical mechanical polishing (CMP) process is shown. In FIG. 35, a bottom electrode 284 has been formed on an insulator 282 to form a substrate 285 on which a ferroelectric/dielectric self-patterning active material 286 has been deposited, patterned, and annealed as described above in the other examples. A thick layer of oxide 288, which may be any suitable insulator but is preferably self-patterned silicon dioxide, has been formed, and a hole 287 formed in the development process. Then, a top electrode material 290, which is preferably about 2200 Å of platinum, but may be other suitable electrode material or materials, is deposited in hole 287. Then, a CMP polishing step, which is known in the art, is performed to provide the top electrode 292 of about 2000 Å thickness as shown in FIG. 36. This CMP process may be used in combination with any of the processes discussed above or below to fabricate an integrated circuit. For example, it may be used as an alternative series of steps to pattern the top electrode in any of the processes described above. If used in combination with some processes, such as the process of FIGS. 28–34, then the insulator 288 would be deposited before the active layer 286. As in the other processes, the CMP process described results in the active layer 286 being completely enclosed by substrate 285, insulator 288, and top electrode substance 292 before any harsh processing steps are performed that can harm it.

Figure 37:
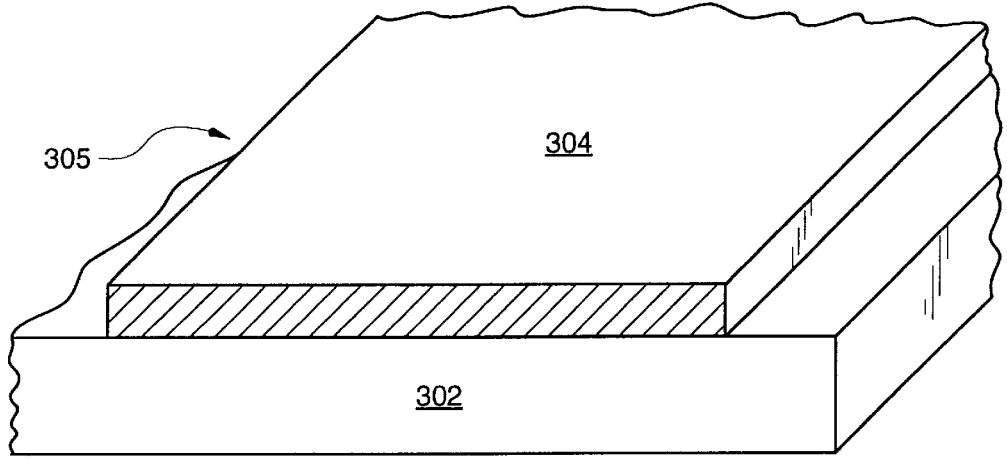
FIGS. 37–41 illustrate various stages in a method according to the invention of making a capacitor in which the ferroelectric or dielectric material is completely enclosed, which method may be utilized in making the DRAM of FIG. 2.
Figure 38:
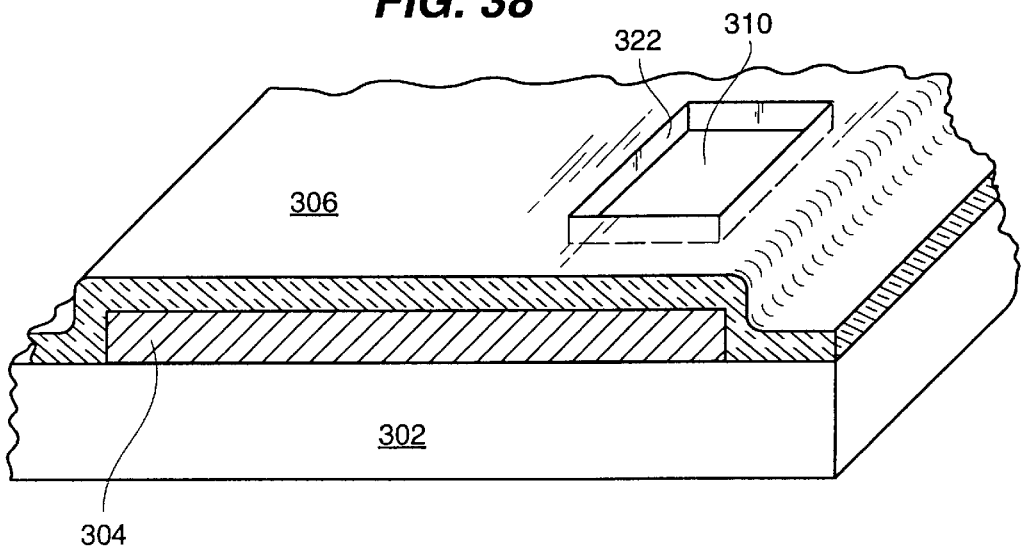
Figure 39:
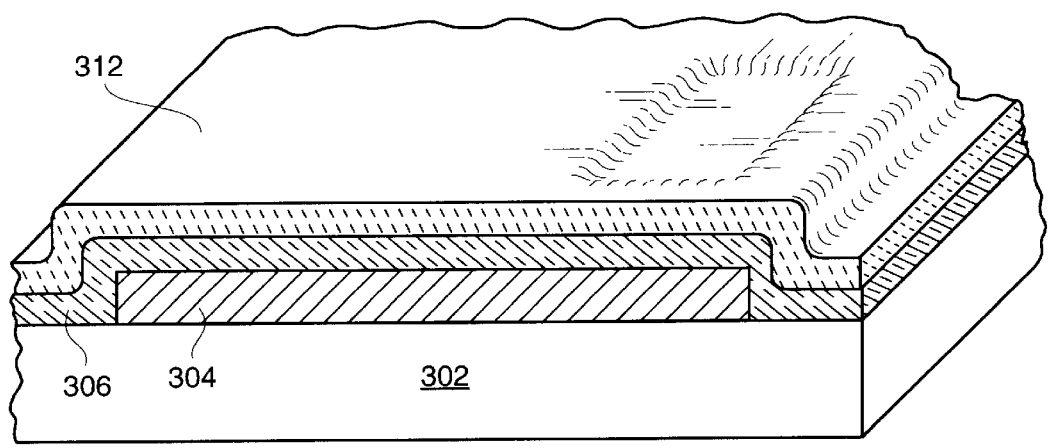
Figure 40:
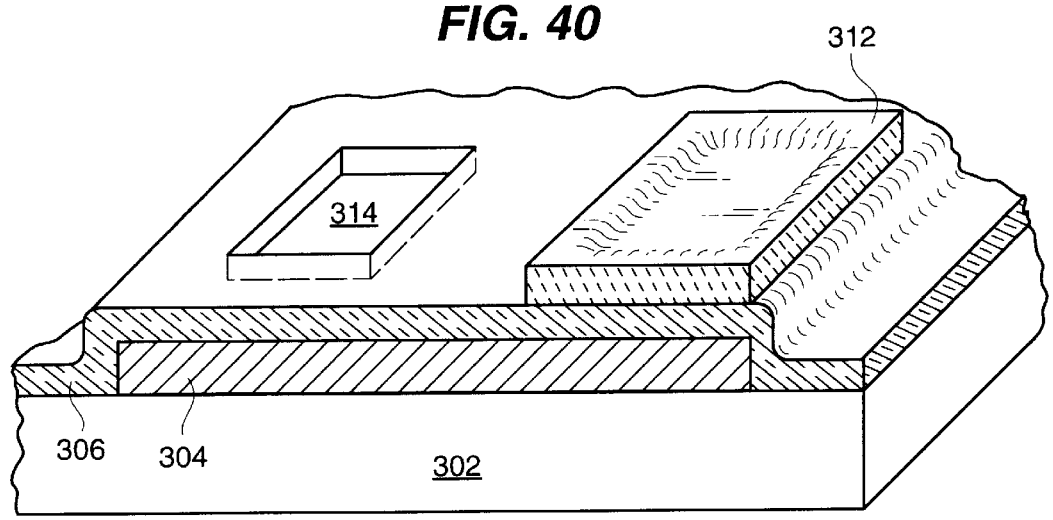
Figure 41:
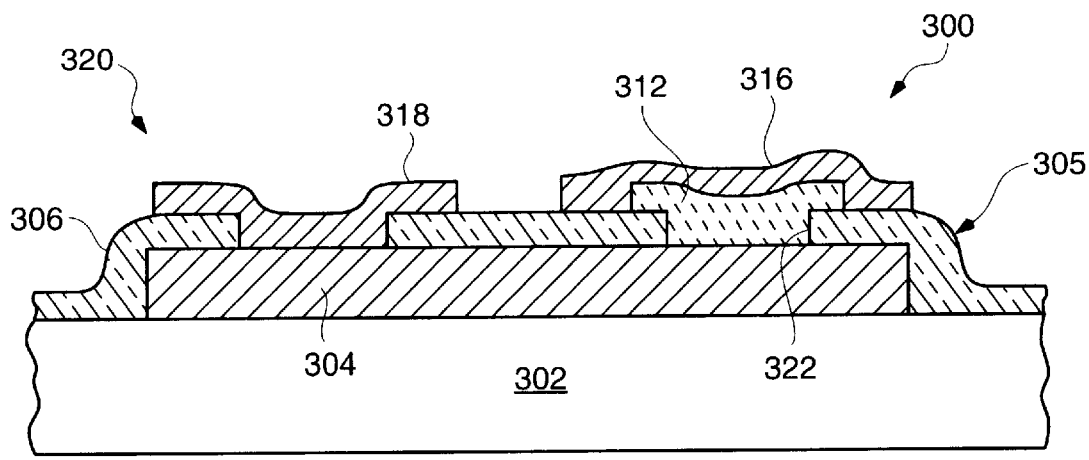
Figure 42:
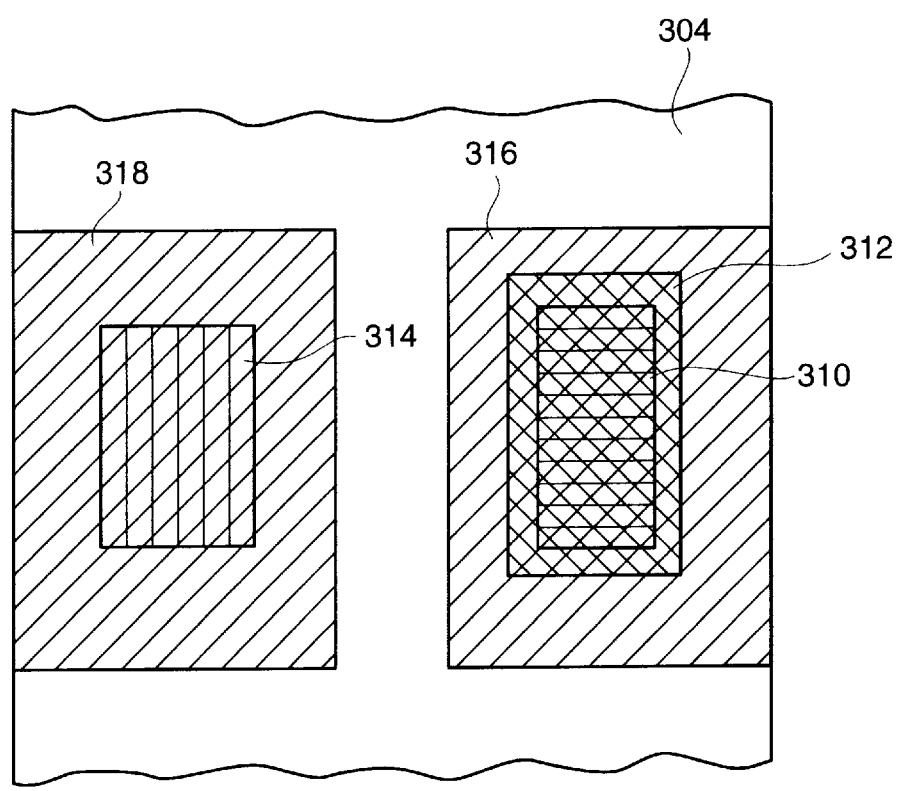
FIG. 42 is a layout of the masks used in fabrication of the capacitor of FIG. 41.

Turning to FIGS. 37 through 42, an alternative process according to the invention for forming a capacitor 300 (FIG. 41) as a portion 320 of an integrated circuit, such as cell 76 of FIG. 2, is illustrated. In FIG. 37 a bottom electrode 304 has been formed on an insulating layer 302 and patterned in a conventional manner, preferably in an ion milling process, to form a substrate 305. Then, in FIG. 38, a layer of insulator 306, preferably a form of silicon dioxide and most preferably SOG, has been deposited over electrode 304 in a conventional process. Then, a via 310 is formed in insulator 306, preferably by a wet etch with HF and $NH_4F$, most preferably, 1 HF (49%)+6 $NH_4F$ (40%), although any other method of patterning may be used. Turning to FIG. 39, next an active layer of a self-patterning ferroelectric/dielectric material is deposited in the manner discussed with respect to FIG. 3 and in particular the steps P204 and P206 of FIG. 43. Again, the material may be any metal oxide, but preferably is a layered superlattice material, and most preferably strontium bismuth tantalate. Then, as indicated in FIG. 40, the ferroelectric/dielectric material 312 is prebaked, irradiated, and developed to pattern it, then dried and annealed as described with respect to FIG. 3 and in particular steps 208–218 in FIG. 43. An $SiO_2$ hole 314 is then formed in insulator 306 down to electrode 304, as described above with respect to FIG. 28. Then, as indicated in FIG. 41, a layer of platinum or other top electrode material is deposited, preferably by sputtering and perferably in a thickness of about 2000 Å, and then patterned, preferably by ion milling, to form top electrode 316 and metalization portion 318. FIG. 42 is an overlay illustrating the various masks used in the process, with the numbers of each mask indicating the element of integrated circuit 320 that was formed by the mask for ease of identification: 304 the bottom electrode, 310 the via, 312 the ferroelectric/dielectric material, 314 the $SiO_2$ hole, and 316 and 318 being different portions of the same mask that patterned the top electrode and metalization. This process is quite similar to the process of FIGS. 28–36, though it shows more clearly the complete envelopment of active layer 312 by substrate 305, ILD 306, and top electrode substance 316. The process of FIGS. 37–44 may be used in combination with any of the processes discussed above to fabricate an integrated circuit.

It is a feature of the process and circuit of FIGS. 28–34 and 3742 that ferroelectric/dielectric material 312 overlaps the edges 322 of via 310 after patterning. The material 312 usually tends to shrink during anneal, and this overlap prevents material deposited in the top electrode deposition from extending through the via 310 and causing shorting between the top electrode 316 and the bottom electrode 304. It is a further feature of the process and circuit of FIGS. 37–42 that ferroelectric/dielectric material 312 is completely enclosed by bottom electrode 304, insulator 306 and top electrode 316. As indicated above, this protects the material 312 from subsequent processing prior to the deposition of a passivation layer, such as 95 in FIG. 2. Similarly, it is evident that in the process of FIGS. 31 and 32 the outer circumference of hole 289 is within the outer circumference of active layer 286. Thus if hole 289 is considered a "via" the active layer 286 overlaps the via and prevents shorting in case of any shrinkage of active layer 286 during the anneal, which may particularly occur if insulator 288 and active layer 286 are annealed together.

There has been described for the first time herein a process for fabricating an integrated circuit utilizing a self-patterning ferroelectric or dielectric material that is ultimately incorporated as an active element into the integrated circuit, as well as integrated circuits made by that process. While this process and the circuits have been described in terms of what is at present considered to be the preferred embodiments of the invention, it will be understood that the invention can be embodied in other specific forms without departing from its spirit or essential characteristics. Now that a process for fabricating an integrated circuit incorporating these materials and the circuit itself, the alternative ways of protecting the material during the process and subsequent processing steps, and the many other features and of the process and circuit have been disclosed, many modifications and variations of the disclosed process and circuits and the principles underlying them may be devised. The present embodiments are, therefore, to be considered as illustrative and not restrictive. The scope of the invention is indicated by the appended claims.

We claim:

1. A method of fabricating an integrated circuit comprising the steps of:

providing a substrate;

providing a first photosensitive liquid solution including one or more elements in appropriate amounts for forming a first desired material upon the application of said first photosensitive liquid solution to said substrate to form a thin film, exposure of the thin film to radiation, development of the thin film, and the treatment of said film to form a solid material;

applying said first photosensitive liquid solution to said substrate to form a first thin film of said first photosensitive liquid solution on said substrate;

patterning said first thin film through exposure of said first film to radiation and subsequent development;

treating of said first thin film to form a first solid film of said first desired material; and completing the fabrication of said integrated circuit to include at least a portion of said first solid film in an active component of said integrated circuit.

2. A method as in claim 1 wherein said first desired material comprises a layered superlattice material.

3. A method as in claim 2 wherein said layered superlattice material comprises a material selected from the group consisting of: strontium bismuth tantalate, strontium bismuth niobate, strontium bismuth tantalum niobate, strontium bismuth titanate, bismuth titanate, lead bismuth niobate, barium bismuth tantalate, lead bismuth tantalate, and barium bismuth niobate.

4. A method as in claim 1 wherein said first desired material includes an element selected from the group consisting of: the transition metals, the lanthanide series metals, the rare earth metals, the alkali metals, magnesium, zinc, cadmium, aluminum, gallium, indium, thallium, germanium, lead, tin, antimony, bismuth, selenium, tellurium, phosphorous, silicon, and boron.

5. A method as in claim 4 wherein said transition metals include scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; said lanthanide series metals include cerium, praseodymium, neodymium, promethium, samarium, europium, gadolinium, terbium, dysprosium, holmium, erbium, thulium, ytterbium, and lutetium; said rare earth metals include calcium, strontium, barium, and radium; and said alkali metals include lithium, sodium, potassium, rubidium, cesium, and francium.

6. A method as in claim 1 wherein said first desired material comprises a metal oxide.

7. A method as in claim 1 wherein said step of completing includes a step of patterning a portion of said integrated circuit with a lift-off process.

8. A method as in claim 7 wherein said step of patterning with a lift-off process comprises the steps of:
depositing a layer of photo resist over said solid film;
patterning said photo resist by exposure to radiation through a mask and developing it to create a hole through said resist to said solid film;
forming a layer of a substance on said photo resist and on said solid film in the region of said hole; and
stripping said photo resist to remove said substance except substantially in the area where it contacts said solid film.

9. A method as in claim 7 wherein said step of patterning with a lift-off process comprises the steps of:
depositing a layer of photo resist over said solid film;
forming a layer of a first substance on said photo resist;
patterning said first substance to create a hole exposing said photo resist;
etching said photo resist to extend said hole through said photo resist to said solid film;
forming a layer of a second substance on said first substance and on said solid film in the region of said hole; and
stripping said photo resist to remove said first substance and to remove said second substance except substantially in the area where it contacts said solid film.

10. A method as in claim 1 and further including the steps of:
providing a second photosensitive liquid solution including one or more elements in appropriate amounts for forming a second desired material upon the formation of a thin film of said second photosensitive liquid solution, exposure of the thin film to radiation, development of the thin film, and the treatment of said film to form a second solid material;
applying said second photosensitive liquid solution to said first thin film to form a second thin film of said second photosensitive liquid solution on said first thin film;
patterning said second thin film through exposure of said second thin film to radiation and subsequent development;
treating said second thin film to form a second solid film of said second desired material;
forming a layer of a substance on said second thin film; and
patterning said substance to create a hole to said second thin film, whereby said second thin film protects said first thin film during the creation of said hole.

11. A method as in claim 10 wherein said step of patterning said substance includes reducing said second thin film and said step of treating said first thin film comprises evaporating said reduced second thin film and incorporating whatever remains of said second thin film into said first solid film.

12. A method as in claim 10 wherein said second thin film comprises bismuth.

13. A method as in claim 10 wherein said step of applying said second photosensitive liquid solution is performed after said step of treating said first thin film.

14. A method as in claim 10 wherein said steps of treating said first thin film and treating said second thin film are performed simultaneously.

15. A method as in claim 1 and further comprising the steps of:
providing a second photosensitive liquid solution including one or more elements in appropriate amounts for forming an insulating material upon the application of said second photosensitive liquid solution to said first thin film, exposure of the thin film to radiation, development of the thin film, and the treatment of said film to form a second solid material;
applying said first photosensitive liquid solution to said first thin film to form a second thin film of said second photosensitive liquid solution on said substrate;
patterning said second thin film through exposure of said second thin film to radiation and subsequent development;
treating said second thin film to form a second solid film of said insulator overlying said first solid film; and
said step of completing comprises completing the fabrication of said integrated circuit to include at least a portion of said second solid film in a component of said integrated circuit.

16. A method as in claim 15 wherein said step of patterning comprises creating a hole through said second thin film to said first thin film, and forming a layer of a substance on said second thin film, which layer passes through said hole and contacts said first thin film.

17. A method as in claim 15 wherein said steps of treating said first thin film and treating said second thin film are performed simultaneously.

18. A method as in claim 15 wherein said steps of treating said first thin film and treating said second thin film are performed separately.

19. A method as in claim 1 wherein:
said step of providing a substrate comprises providing a substrate including a layer of insulator having a hole in it;
said step of applying includes forming said first thin film with a portion of it in said hole; and
said step of completing includes forming a layer of a substance on said first solid thin film and said insulator and patterning said layer of said substance so said first solid film is completely enclosed by said substrate, said insulator, and said substance.

20. A method as in claim 19 wherein said step patterning further comprises forming said first thin film so that it plugs said hole, with a first portion within said hole and a second portion, contiguous with said first portion, overlaps the edges of said hole sufficiently so that upon shrinkage in said treating step, said first thin film still completely plugs said hole.

21. A method as in claim 19 wherein said substrate comprises a conductor, said insulator is a form of silicon dioxide and said substance comprises a conductor.

22. A method as in claim 19 wherein said step of patterning comprises ion milling.

23. A method as in claim 19 wherein said step of patterning comprises chemical-mechanical polishing.

24. A method as in claim 1 wherein said step of completing comprises forming a layer of insulator on said substrate and said first solid film, creating a hole through said insulator to said first solid film, forming a layer of a substance on said insulator and said solid film, and patterning said layer of substance so said first solid film is completely enclosed by said substrate, said insulator and said first substance.

25. A method as in claim 24 wherein said step of creating said hole comprises forming said hole so that its outer circumference is within the outer circumference of said first thin film.

26. A method as in claim 24 wherein said substrate comprises a conductor, said insulator is a form of silicon dioxide and said substance comprises a conductor.

27. A method as in claim 24 wherein said step of patterning comprises ion milling.

28. A method as in claim 24 wherein said step of patterning comprises chemical-mechanical polishing.

29. A method of fabricating an integrated circuit including a layered superlattice material, said method comprising the steps of:

providing a substrate;

providing a first photosensitive liquid solution including one or more elements in appropriate amounts for forming a layered superlattice material upon the application of said first photosensitive liquid solution to said substrate to form a thin film, exposure of the thin film to radiation, development of the thin film, and the treatment of said film to form a solid material;

applying said first photosensitive liquid solution to said substrate to form a first thin film of said first photosensitive liquid solution on said substrate;

patterning said first thin film through exposure of said first film to radiation and subsequent development;

treating of said first thin film to form a first solid film of said layered superlattice material; and completing the fabrication of said integrated circuit to include at least a portion of said layered superlattice material in a component of said integrated circuit.

30. A method as in claim 29 and further including the steps of:

providing a second photosensitive liquid solution including one or more elements in appropriate amounts for forming a protective material upon the formation of a thin film of said second photosensitive liquid solution, exposure of the thin film to radiation, development of the thin film, and the treatment of said film to form a second solid material;

applying said second photosensitive liquid solution to said first thin film to form a second thin film of said second photosensitive liquid solution on said first thin film;

patterning said second thin film through exposure of said second thin film to radiation and subsequent development;

treating said second thin film to form a second solid film of said protective material;

forming a layer of a substance on said second thin film; and patterning said substance to create a hole to said second thin film, whereby said protective material protects said first thin film during the creation of said hole.

31. A method as in claim 30 wherein said step of patterning said substance includes reducing said protective material and said step of treating said first thin film comprises evaporating said reduced material and incorporating whatever remains of said reduced material into said layered superlattice material.

32. A method as in claim 30 wherein said layered superlattice material and said protective material both include bismuth.

33. A method as in claim 30 wherein said step of applying said second photosensitive liquid solution is performed after said step of treating said first thin film.

34. A method as in claim 30 wherein said steps of treating said first thin film and treating said second thin film are performed simultaneously.

* * * * *

UNITED STATES PATENT AND TRADEMARK OFFICE
CERTIFICATE OF CORRECTION

PATENT NO : 6,022,669
DATED : February 8, 2000
INVENTOR(S) : Hiroto Uchida, et al.

It is certified that error appears in the above-identified patent and that said Letters Patent is hereby corrected as shown below:

On title page, item 75 Inventors
replace "Gary F. Derbenuick"
with --Gary F. Derbenwick--.

Signed and Sealed this

Twenty-third Day of January, 2001

Attest:

Q. TODD DICKINSON

Attesting Officer

Commissioner of Patents and Trademarks